United States Patent
Kwag et al.

(10) Patent No.: US 9,978,785 B2
(45) Date of Patent: May 22, 2018

(54) IMAGE SENSOR

(71) Applicant: SK hynix Inc., Gyeonggi-do (KR)

(72) Inventors: Pyong-Su Kwag, Gyeonggi-do (KR); Ho-Ryeong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 106 days.

(21) Appl. No.: 15/238,529

(22) Filed: Aug. 16, 2016

(65) Prior Publication Data

US 2017/0330907 A1    Nov. 16, 2017

(30) Foreign Application Priority Data

May 16, 2016    (KR) .................. 10-2016-0059459

(51) Int. Cl.
    *H01L 27/146*    (2006.01)

(52) U.S. Cl.
    CPC .. *H01L 27/14607* (2013.01); *H01L 27/14636* (2013.01)

(58) Field of Classification Search
    CPC ......... H01L 27/14643; H01L 27/14612; H01L 27/14603; H01L 27/14614; H01L 27/14605; H01L 27/14607; H01L 27/14609; H01L 27/14689
    See application file for complete search history.

(56) References Cited

U.S. PATENT DOCUMENTS

| | | | |
|---|---|---|---|
| 8,378,391 B2 * | 2/2013 | Koyama | H01L 27/1225 257/223 |
| 9,293,501 B2 * | 3/2016 | Ahn | H01L 27/14634 |
| 2015/0048366 A1 | 2/2015 | Koyama et al. | |
| 2016/0104734 A1 * | 4/2016 | Hirose | H01L 27/1225 257/43 |

* cited by examiner

*Primary Examiner* — Roy Potter
(74) *Attorney, Agent, or Firm* — IP & T Group LLP

(57) ABSTRACT

An image sensor may include: a substrate including a photoelectric conversion element; a first interlayer dielectric layer formed over the photoelectric conversion element; a channel layer including a first region and a second region, the first region being formed in an opening passing through the first interlayer dielectric layer, with a portion of the first region contacting the photoelectric conversion element, and the second region being formed over the first interlayer dielectric layer; a transfer transistor formed over the first region of the channel layer, the transfer transistor including a transfer gate which gapfills the opening; and a reset transistor including a reset gate formed over the second region of the channel layer.

27 Claims, 16 Drawing Sheets

IMAGE SENSOR

CROSS-REFERENCE TO RELATED APPLICATION

This application claims priority under 35 U.S.C. § 119(a) to Korean Patent Application No. 10-2016-0059459 filed on May 16, 2016, the disclosure of which is herein incorporated by reference in its entirety.

TECHNICAL FIELD

Exemplary embodiments of the present disclosure relate generally to a semiconductor device technology and, more particularly, to an image sensor.

BACKGROUND

An image sensor converts an optical image into an electrical signal. Recent developments in the computer and the communication industries demand an image sensor with improved performance which can be used in various applications such as a digital camera, a camcorder, a personal communication system (PCS), a game machine, a security camera, a medical micro camera, a robot, and the like.

SUMMARY

Various embodiments are directed to an image sensor with improved performance.

In an embodiment, an image sensor may include: a substrate including a photoelectric conversion element; a first interlayer dielectric layer formed over the photoelectric conversion element; a channel layer including a first region and a second region, the first region being formed in an opening passing through the first interlayer dielectric layer, with a portion of the first region contacting the photoelectric conversion element, and the second region being formed over the first interlayer dielectric layer; a transfer transistor formed over the first region of the channel layer, the transfer transistor including a transfer gate which gapfills the opening; and a reset transistor including a reset gate formed over the second region of the channel layer. Moreover, the image sensor may further include: a second interlayer dielectric layer formed over the first interlayer dielectric layer; a first contact plug formed in the second interlayer dielectric layer, the first contact plug being coupled to the transfer gate; a second contact plug formed in the second interlayer dielectric layer, the second contact plug being coupled to the channel layer between the reset gate and the transfer gate disposed on one side of the reset gate; a third contact plug formed in the second interlayer dielectric layer, the third contact plug being coupled to the reset gate; and a fourth contact plug formed in the second interlayer dielectric layer, the fourth contact plug being coupled to the channel layer on the other side of the reset gate. Furthermore, the image sensor may further include: a first conductive layer, which is formed between the first interlayer dielectric layer and the channel layer, and through which the opening passes; and a second conductive layer disposed adjacent to the reset gate and formed between the first interlayer dielectric layer and the channel layer. The first conductive layer may be disposed under the second contact plug, and the second conductive layer may be disposed under the fourth contact plug.

The opening may be disposed in a central portion of the photoelectric conversion element. The channel layer may include undoped polysilicon or P-type polysilicon. The channel layer may include N-type polysilicon. The transfer gate may include: a first gate dielectric layer formed over the channel layer; and a pillar-shaped first gate electrode formed over the first gate dielectric layer and configured to gapfill at least the opening. The reset gate may include: a second gate dielectric layer formed over the channel layer; and a planar second gate electrode formed over the second gate dielectric layer. The transfer gate and the reset gate may include a gate dielectric layer, and wherein, the gate dielectric layer may be formed along a surface of a structure including the first interlayer dielectric layer and the channel layer, has a substantially constant thickness, and covers an entirety of the surface of the structure.

In an embodiment, an image sensor may include: a substrate including a photoelectric conversion element; a first interlayer dielectric layer formed over the photoelectric conversion element; an opening formed to pass through the first interlayer dielectric layer to expose the photoelectric conversion element; a first channel layer including a first region formed in the opening with a portion of the first region contacting the photoelectric conversion element, and a second region formed over a portion of the first interlayer dielectric layer; a transfer transistor formed over the first region of the first channel layer and including a transfer gate which gapfills the opening; a reset transistor including a reset gate formed over the second region of the first channel layer; a second channel layer formed over another portion of the first interlayer dielectric layer; a floating diffusion layer formed between the first interlayer dielectric layer and a first end of the second channel layer; and a drive transistor including a drive gate formed over the second channel layer so that a portion of the drive gate overlaps the floating diffusion layer. Moreover, the image sensor may further include: a selection transistor including a selection gate disposed adjacent to the drive gate and formed over the second channel layer. Furthermore, the image sensor may further include: a second interlayer dielectric layer formed over the first interlayer dielectric layer; a first contact plug formed in the second interlayer dielectric layer and coupled to the transfer gate; a second contact plug formed in the second interlayer dielectric layer and coupled to the first channel between the reset gate and the transfer gate disposed on one side of the reset gate; a third contact plug formed in the second interlayer dielectric layer and coupled to the reset gate; a fourth contact plug formed in the second interlayer dielectric layer and coupled to the first channel layer on the other side of the reset gate; a fifth contact plug formed in the second interlayer dielectric layer and coupled to the first end of the second channel layer; a sixth contact plug formed in the second interlayer dielectric layer and coupled to the drive gate; a seventh contact plug formed in the second interlayer dielectric layer and coupled to the selection gate; and an eighth contact plug formed in the second interlayer dielectric layer and coupled to a second end of the second channel layer. The same level of voltage may be applied to the fourth contact plug and the fifth contact plug during an operation. A power supply voltage or a higher voltage may be applied to the fourth contact plug and the fifth contact plug during an operation. Furthermore, the image sensor may further include: a first conductive layer formed between the first interlayer dielectric layer and the first channel layer, and through which the opening passes; a second conductive layer disposed adjacent to the reset gate and formed between the first interlayer dielectric layer and the first channel layer; and a third conductive layer disposed adjacent to the selection gate and formed between the first interlayer dielectric layer and the second end of the second channel layer. The first conductive layer and the second conductive layer may be respectively disposed under the second contact plug and the fourth contact plug, and wherein the floating diffusion layer and the third conductive layer may be respectively disposed under the fifth contact plug and the eight contact plug.

The opening may be disposed in a central portion of the photoelectric conversion element. The first channel layer and the second channel may have the same conductivity type, wherein each of the first channel layer and the second channel layer may include any one of undoped polysilicon, P-type polysilicon or N-type polysilicon. The first channel layer and the second channel may have different conductivity types, wherein the first channel layer may include N-type polysilicon, and the second channel layer may include undoped polysilicon or P-type polysilicon. The transfer gate may include: a first gate dielectric layer formed over the first channel layer; and a pillar-shaped first gate electrode formed over the first gate dielectric layer and configured to gapfill at least the opening. The reset gate may include: a second gate dielectric layer formed over the first channel layer; and a planar second gate electrode formed over the second gate dielectric layer. The drive gate may include: a third gate dielectric layer formed over the second channel layer; and a stepped third gate electrode, which is formed over the third gate dielectric layer, and a portion of which overlaps the floating diffusion layer. The transfer gate, the reset gate and the drive gate may include a gate dielectric layer, and wherein the gate dielectric layer may be formed along a surface of a structure including the first interlayer dielectric layer, the floating diffusion layer, the first channel layer and the second channel layer, has a substantially constant thickness, and covers an entirety of the surface of the structure.

In an embodiment, an image sensor may include: photoelectric conversion element; a transfer transistor and a reset transistor formed over a portion of the photoelectric conversion element and coupled in series to each other while sharing a first channel layer coupled to the photoelectric conversion element; and a drive transistor and a selection transistor formed over another portion of the photoelectric conversion element and coupled in series to each other while sharing a second channel layer, wherein the transfer transistor includes a vertical channel, and each of the reset transistor, the drive transistor and the selection transistor comprises a thin film transistor.

The transfer gate may include: an interlayer dielectric layer formed over the photoelectric conversion element; an opening formed to pass through the interlayer dielectric layer and expose the photoelectric conversion element; and a transfer gate configured to gapfill the opening, wherein the first channel layer is formed along a bottom and a side surface of the opening between the transfer gate and the opening. The opening may be disposed in a central portion of the photoelectric conversion element. The drive transistor may include: an interlayer dielectric layer formed over the photoelectric conversion element; the second channel layer formed over the interlayer dielectric layer; a floating diffusion layer formed between the second channel layer and the interlayer dielectric layer; and a drive gate, which is formed over the second channel layer, a portion of which overlaps the floating diffusion layer.

BRIEF DESCRIPTION OF THE DRAWINGS

The above and other features and advantages of the present' invention will become more apparent to those skilled in the art to which the present invention belongs by describing in detail various embodiments thereof with reference to the attached drawings in which.

DETAILED DESCRIPTION

Figure 1:
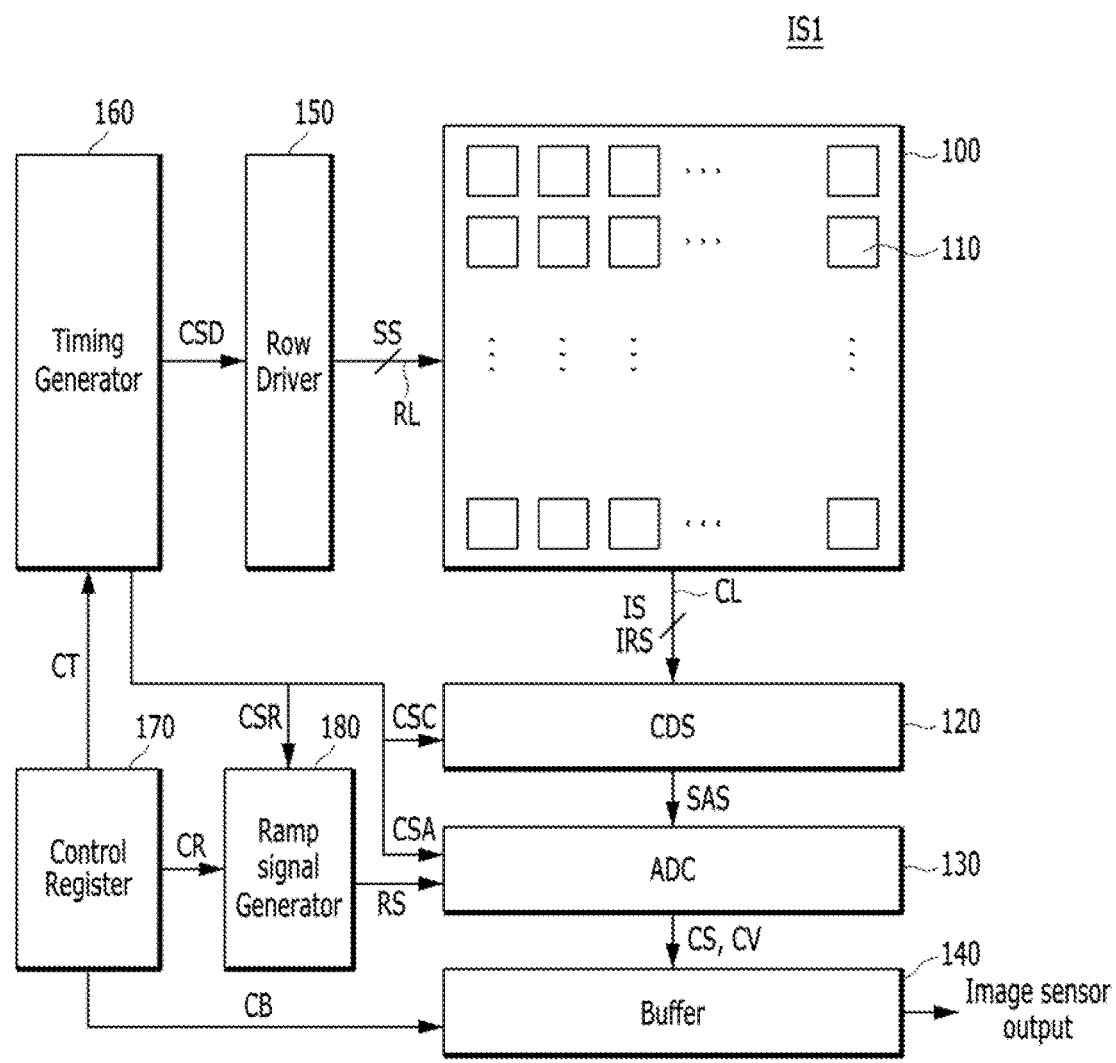
FIG. 1 is a block diagram schematically illustrating an image sensor, in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The drawings are not necessarily to scale and in some instances, proportions may have been exaggerated clearly illustrate features of the embodiments. When a first layer is referred to as being "on" a second layer or a substrate, it not only refers to a case in which the first layer is formed directly on the second layer or the substrate but also a case in which a third layer exists between the first layer and the second layer or the substrate.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention. The terminology used herein is for the purpose of describing particular embodiments only and is not intended to be limiting of the present invention. As used herein, singular forms are intended to include the plural forms as well, unless the context dearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature, described in connection with one embodiment may be used singly or in combination with other elements of another embodiment, unless specifically indicated otherwise.

Hereinafter, the various embodiments of the present invention will be described in detail with reference to the attached drawings.

The following embodiments provide an image sensor with improved performance, for example, an image sensor capable of providing a high-pixel image. To provide a high pixel image, an image sensor having a large number of unit pixels integrated in a limited area is required. Each of the unit pixels included in an image sensor with an embodiment of the present invention may have a shape allowing a photoelectric conversion element and the pixel transistors in each pixel unit to be vertically stacked. The image sensor may have a fill factor of about 100% as the photoelectric conversion element and the pixel transistors overlap in each of the unit pixels.

FIG. 1 is a block diagram schematically illustrating an image sensor generally designated with symbol IS1, in accordance with an embodiment of the present invention. The image sensor IS1 may include a pixel array 100, a correlated double sampler (CDS) 120, an analog-to-digital converter (ADC) 130, a buffer 140, a row driver 150, a timing generator 160, a control register 170, and a ramp signal generator 180. The pixel array 100 may include a plurality of unit pixels 110 arranged in a matrix shape including rows and columns. Although, a cross section of the pixel array 100 is shown in FIG. 1 it should be understood that the pixel array 100 may be a three dimensional matrix.

The timing generator 160 may generate one or more control signals CSD, CSC, CSA, and CSR for controlling the row driver 150, the CDS 120, the ADC 130, and the ramp signal generator 180, respectively. The control register 170 may generate one or more control signals CR, CT, and CB for controlling the respective operations of the ramp signal generator 180, the timing generator 160, and the buffer 140, respectively.

The row driver 150 may drive the pixel array 100 on a row line RL basis. For example, the row driver 150 may generate a select signal SS for selecting any one row line of a plurality of row lines. Each of the unit pixels 110 may sense incident light and output an image reset signal IRS and an image signal IS to the CDS 120 through a column line CL. The CDS 120 may perform sampling for each of the received image reset signal IRS and the image signal IS.

The ADC 130 may compare a ramp signal RS outputted from the ramp signal generator 180 with a sampling signal SAS outputted from the CDS 120, and output a comparison signal CS. According to a clock signal CLS provided from the timing generator 160, the ADC 130 may count the level transition time of the comparison signal CS, and output a count value CV to the buffer 140. The ramp signal generator 180 may operate under control of the timing generator 160.

The buffer 140 may store a plurality of digital signals outputted from the ADC 130, and then sense and amplify each of the digital signals. Thus, the buffer 140 may include a memory (not shown) and a sense amplifier (not shown). The memory may function to store count values, and the count values may mean count values related to signals outputted from the plurality of unit pixels 110. The sense amplifier may sense and amplify each of the count values outputted from the memory.

To provide a high-pixel image, the number of unit pixels 110 integrated in the pixel array 100 needs to be increased. That is, a larger number of unit pixels 110 needs to be arranged in a limited area. For this structure, the physical size of each unit pixel 110 needs to be reduced. However, the image sensor is operated based on a pixel signal generated from each of the unit pixels 110 in response to incident light. Thus, when the physical size of the unit pixel 110 is reduced, the characteristics of the unit pixel 110 are degraded.

The following embodiments are directed to an image sensor which is capable not only of maximizing the fill factor of the photoelectric conversion element but also of securing the area and characteristics for the pixel transistors, despite reducing the physical size.

Figure 2:
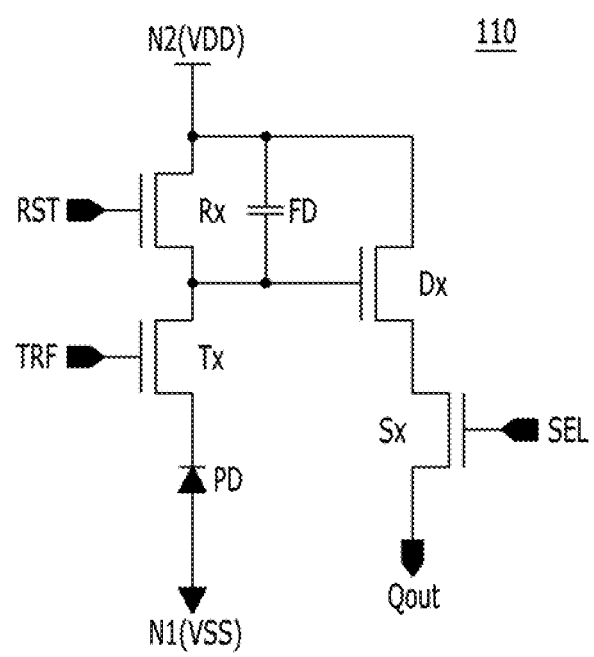
FIG. 2 is an equivalent circuit diagram of a unit pixel of an image sensor, in accordance with an embodiment of the present invention.
Figure 3:
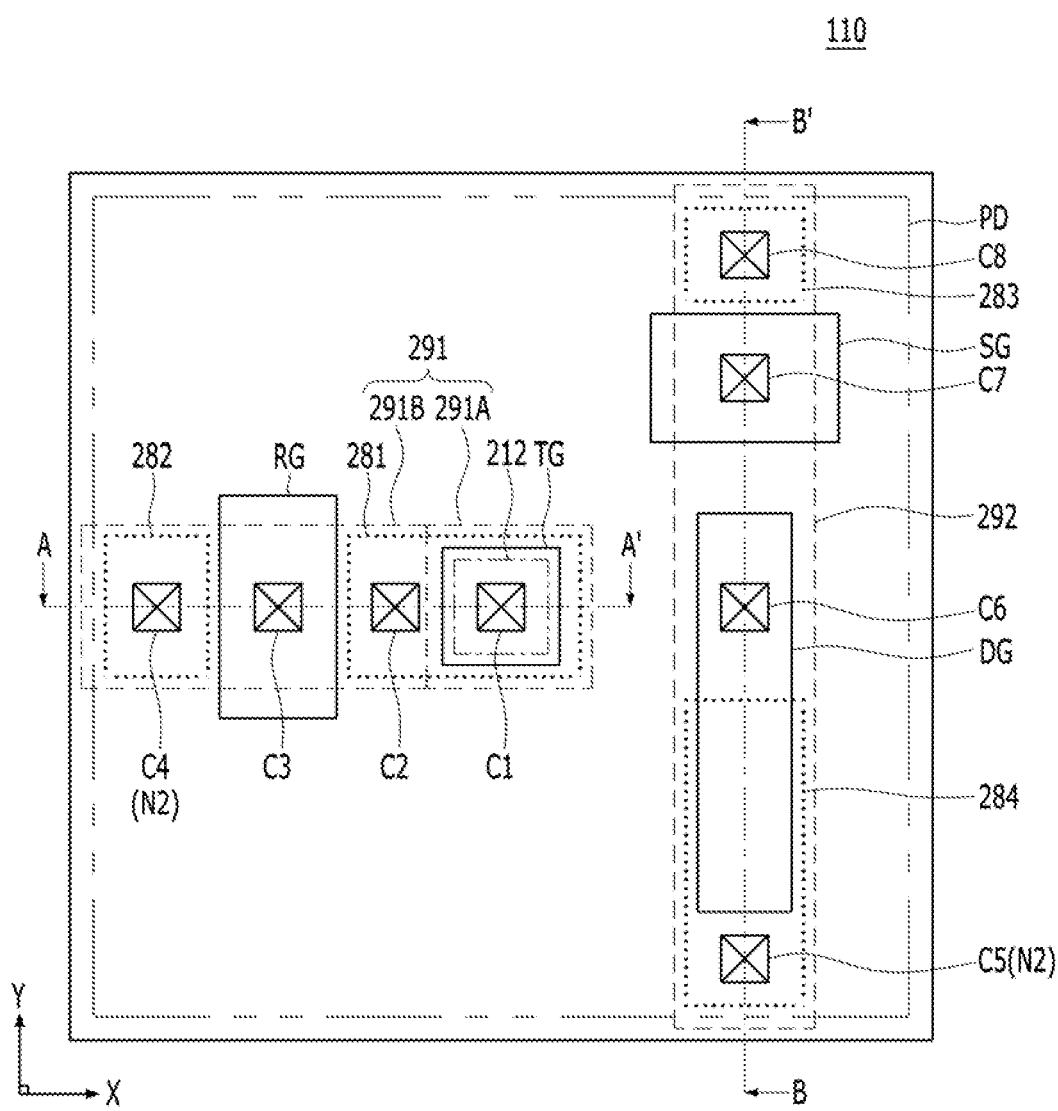
FIG. 3 is a plane view schematically illustrating the unit pixel of an image sensor, in accordance with an embodiment of the present invention.
Figure 4A:
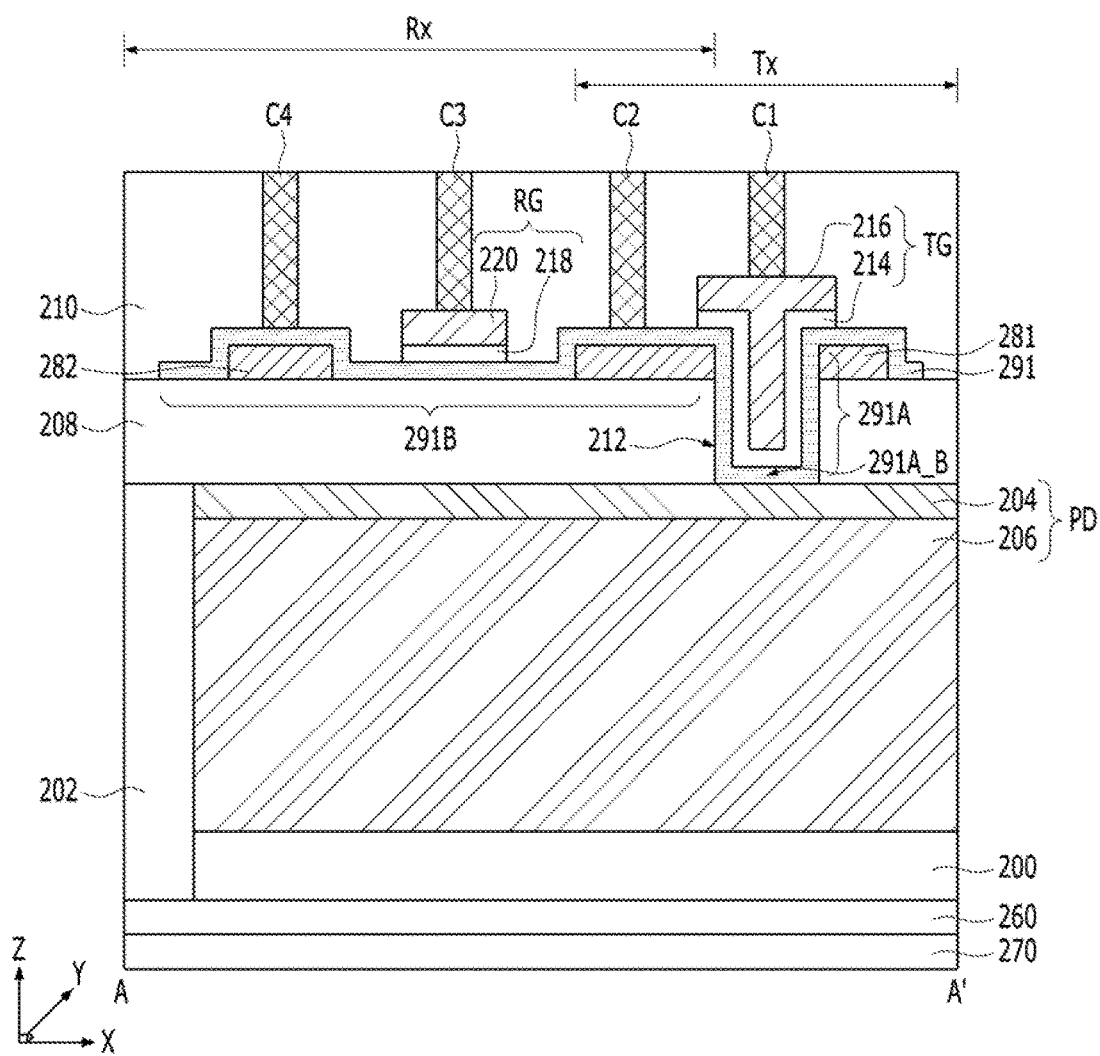
FIGS. 4A and 4B are sectional views respectively taken along line A-A' and line B-B' of FIG. 3.
Figure 4B:
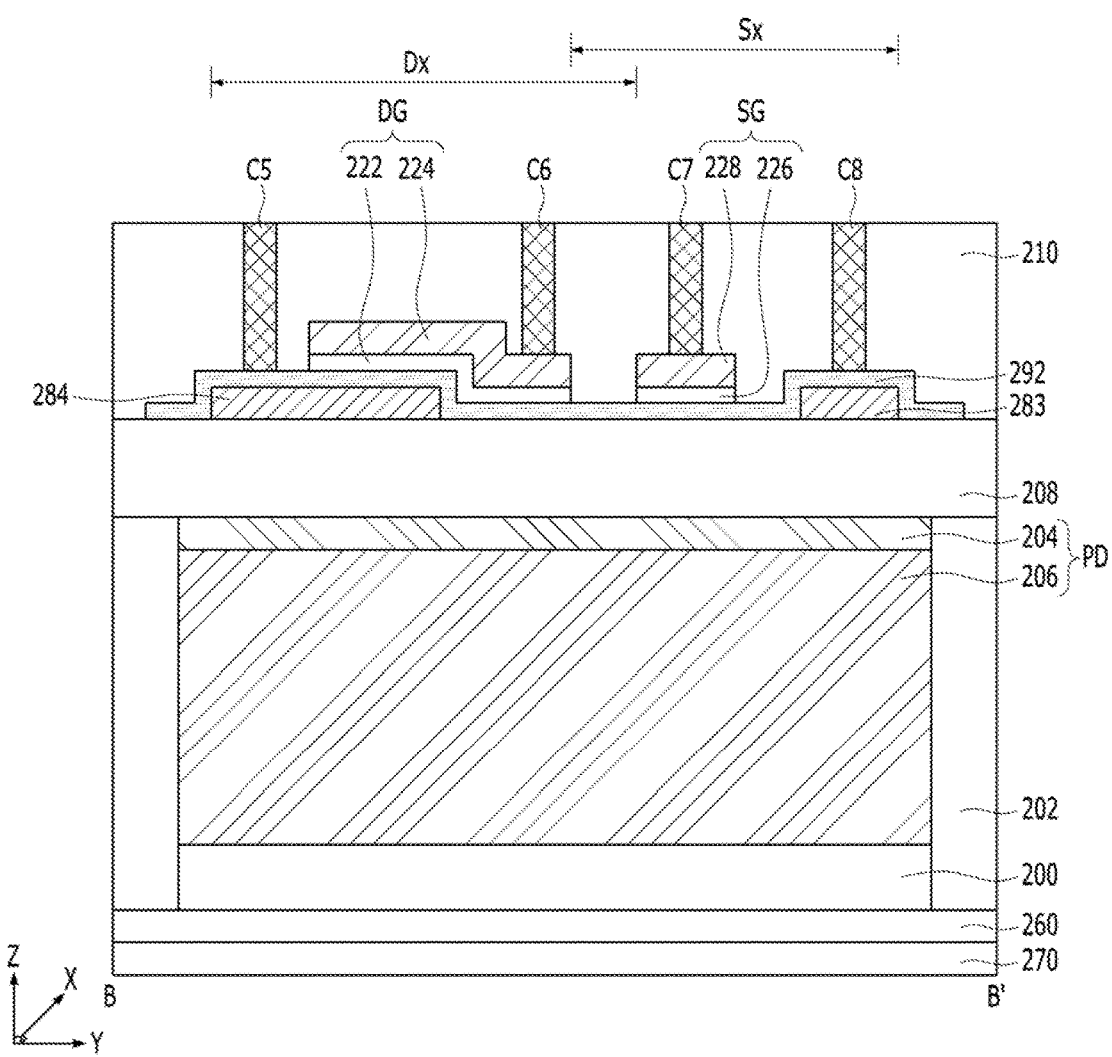

FIG. 2 is an equivalent circuit diagram of a unit pixel 110 of the image sensor IS1, in accordance with an embodiment of the present invention. FIG. 3 is a plane view schematically illustrating the unit pixel 110 of the image sensor IS1 in accordance with an embodiment of the present invention. FIGS. 4A and 4B are cross sectional views respectively taken along line A-A' and line B-B' of FIG. 3.

As shown in FIG. 2, the unit pixel 110 of the image sensor IS1, may include a photoelectric conversion element PD, a transfer transistor Tx, a reset transistor Rx, a drive transistor, Dx, a selection transistor Sx and a floating diffusion FD. The drive transistor may also be called a source follower transistor.

The photoelectric conversion element PD, which generates a photocharge in response to incident light, may include a photodiode coupled between the transfer transistor Tx and a first node N1 set to a ground voltage VSS. In detail, an anode of the photoelectric conversion element PD may be coupled to the first node N1, and a cathode of the photoelectric conversion element PD may be coupled to a source of the transfer transistor Tx.

The transfer transistor Tx may be coupled between the photoelectric conversion element PD and the reset transistor Rx. In detail, a drain of the transfer transistor Tx may be coupled to a source of the reset transistor Rx, the floating diffusion FD and a gate DG of the drive transistor Dx. The transfer transistor Tx may transmit, in response to a transfer signal TRF applied to the gate TG of the transfer transistor Tx, the photocharge generated from the photoelectric conversion element PD to the floating diffusion FD.

The reset transistor Rx may be coupled between the transfer transistor Tx and a second node N2 set to a power supply voltage VDD or a higher voltage. In detail, a drain of the reset transistor Rx may be coupled to the second node N2 and a drain of the drive transistor Dx. The source of the reset transistor. Rx may be coupled to the drain of the transfer transistor Tx, the floating diffusion FD and the drive gate DG. The reset transistor Rx may initialize the floating diffusion FD to the voltage of the second node N2, for example, the power supply voltage VDD in response to a reset signal RST applied through a reset gate RG. More specifically, a reset signal applied to the reset gate RG of the reset transistor Rx may turn on or off the reset transistor Rx. When the reset transistor Rx is turned on, the floating diffusion FD is initialized to the voltage VDD of the second node N2.

The drive transistor DX may be coupled between the second node N2 and the selection transistor Sx. The drive gate DG may be coupled to the floating diffusion FD. In more detail, the drain of the drive transistor Dx may be coupled to the second node N2, and the source of the drive transistor Dx may be coupled to the drain of the selection transistor Sx. The drive gate DG may be coupled to the floating diffusion FD, the source of the reset transistor Rx and the drain of the transfer transistor Tx. The drive transistor Dx may generate an output voltage, that is, an image signal and an image reset signal, corresponding to the photocharge stored in the floating diffusion FD.

The select transistor Sx may be coupled between the drive transistor Dx and a column line (not shown). The select transistor Sx may output, as shown by reference Qout, an output voltage generated from the drive transistor Dx, to the column line (not shown) through a selection signal SEL applied through the selection gate SG. For reference, the selection gate SG may be coupled to a row line (not shown).

The floating diffusion FD may have a capacitor structure on an equivalent circuit. In detail, the floating diffusion FD having the capacitor structure may be coupled in parallel with the source and drain of the reset transistor Rx. The floating diffusion FD may include capacitance components formed by overlapping various structures constituting the pixel transistors Tx, Rx, Dx and Sx in vertical and horizontal directions.

As shown in FIGS. 3, 4A and 4B, the unit pixel 110 of the image sensor, in accordance with an embodiment, may have a structure in which the pixel transistors Tx, Rx, Dx and Sx are vertically stacked over the photodiode PD. As shown in FIG. 4A, transistors Tx and Rx at least partially overlap with each other. Also, as shown in FIG. 4B transistors Dx and Sx at least partially overlap with each other.

For example, the transfer transistor Tx and the reset transistor Rx may share a first channel layer 291. The first channel layer 291 may have an elongated bar shape extending in a first direction x. The first channel layer 291 may be disposed on a portion of the photoelectric conversion element PD. The transfer transistor Tx and the reset transistor Rx may have a shape in which they share the first channel layer 291 and are coupled in series to each other in the x direction.

The drive transistor Dx and the selection transistor Sx may share a second channel layer 292. The second channel layer 292 may have an elongated bar shape extending in a second direction, direction y perpendicularly intersecting the first direction x. The second channel layer 292 may be disposed on another portion of the photoelectric conversion element PD. The drive transistor Dx and the selection transistor Sx may have a shape in which they share the second channel layer 292 and are coupled in series to each other in the y direction.

The transfer transistor Tx may include a vertical channel 291A, extending in a z direction perpendicular to the plane of the x and y directions, so as to transmit a photocharge generated from the photoelectric conversion element. PD, to the floating diffusion FD. Each of the reset transistor Rx, the drive transistor Dx and the selection transistor Sx may comprise a thin film transistor (TFT). The reason for this is to effectively dispose the transistors and form them on the photoelectric conversion element PD.

The first channel layer 291 and the second channel layer 292 may be made of the same material or different materials. The first channel layer 291 and the second channel layer 292 may have the same conductivity type or different conductivity types. Each of the first channel layer 291 and the second channel layer 292 may include a silicon-containing material. For example, each of the first channel layer 291 and the second channel layer 292 may include polysilicon. Each of the first channel layer 291 and the second channel layer 292 may include any one of undoped polysilicon to which no impurity has been doped, P-type polysilicon to which a P-type impurity such as boron (B) has been doped, and N-type polysilicon to which an N-type impurity such as phosphorus (P) or arsenic (As) has been doped.

When the first channel layer 291 and the second channel layer 292 include undoped polysilicon or P-type polysilicon, each of the pixel transistors Tx, Rx, Dx and Sx may operate in an enhancement mode in which, when it is in an off state, the channel is maintained in a disabled state. When the first channel layer 291 and the second channel layer 292 include N-type polysilicon, each of the pixel transistors Tx, Rx, Dx and Sx may operate in a depletion mode in which, when it is in an off state, the channel is maintained in an enabled state. Therefore, characteristics of the pixel circuit configured with the pixel transistor Tx, Rx, Dx and Sx may be enhanced by a method of controlling the conductivity types of the first and second channel layers 291 and 292. For example, the first channel layer 291 may include N-type polysilicon, and the second channel layer 292 may include P-type polysilicon. In this case, since the transfer transistor Tx and the reset transistor Rx operate in the depletion mode, dark current generated from the photoelectric conversion element PD can be easily removed, and the quality of an image in a low light level environment can be more effectively enhanced. Further, since the drive transistor Dx and the selection transistor Sx operate in the enhancement mode, an increase in power consumption caused by the transfer transistor Tx and the reset transistor Rx that operate in the depletion mode can be restricted.

In the illustrated embodiment of FIGS. 3, 4A and 4B, the first and second channel layers 291 and 292 are separately provided. However, the invention is not limited in this way. In another embodiment, the first and second channel layers 291 and 292 may be formed as a single channel layer in which the first channel layer 291 and the second channel layer 292 are directly coupled to each other. For example, in an embodiment, the first channel layer 291 and the second channel layer 292 may be formed into a single channel layer, wherein an end of the first channel layer 291 that corresponds to the drain of the reset transistor Rx is directly coupled with an end of the second channel layer 292 that corresponds to the drain of the drive transistor Dx. As shown in FIGS. 3 and 4A, the unit pixel 110 of the image sensor may include: a substrate 200 which includes the photoelectric conversion element PD; a first interlayer dielectric layer 208 which is formed on the photoelectric conversion element PD; an opening 212 which passes through the first interlayer dielectric layer 208 and exposes the photoelectric conversion element PD; the first channel layer 291 that includes a first region 291A, which is formed in the opening 212, a bottom portion 291A_B of the first region 291A contacting with the photoelectric conversion element PD, and a second region 291B which is formed on a portion of the first interlayer dielectric layer 208; the transfer transistor Tx that includes a transfer gate TG which is formed on the first region 291A of the first channel layer 291 and gapfills at least the opening 212, and the reset transistor Rx which includes a reset gate RG formed on the second region 291B of the first channel layer 291.

Furthermore, the unit pixel 110 of the image sensor in accordance with the embodiment may include a second interlayer dielectric layer 210 which is formed on the first interlayer dielectric layer 208, and first to fourth vertical elongated contact plugs C1 to C4 which pass through the second interlayer dielectric layer 210. The first contact plug C1 may be coupled to the transfer gate TG. A transmission signal TRF may be applied to the transfer gate TG through the first contact plug C1. The second contact plug C2 may be coupled to the first channel layer 291 at a region thereof which corresponds to the drain of the transfer transistor Tx and the source of the reset transistor Rx. The third contact plug C3 may be coupled to the reset gate RG. A reset signal RST may be applied to the reset gate through the third contact plug C3. The fourth contact plug C4 may contact the first channel layer 291 at a region thereof which corresponds to the drain of the reset transistor Rx. Referring to the equivalent circuit diagram, the fourth contact plug C4 may be coupled to the second node N2.

Further as shown in FIG. 4A, the unit pixel 110 may further include a first conductive layer 281 which is formed between the first interlayer dielectric layer 208 and the first channel layer 291 at a first side of the reset gate RG, and through which the opening 212 passes, and a second conductive layer 282 which is formed between the first interlayer dielectric layer 208 and the first channel layer 291 at a second side of the reset gate RG. The first conductive layer 281 may serve as the drain of the transfer transistor Tx and the source of the reset transistor Rx. The first conductive layer 281 may be disposed under the first channel layer 291 in a region under the second contact plug C2. The second conductive layer 282 may serve as the drain of the reset transistor Rx and be disposed under the fourth contact plug C4.

As shown in FIGS. 3 and 4B, the unit pixel 110 may include the second channel layer 292 that is formed on another portion of the first interlayer dielectric layer 208, a floating diffusion layer 284 which formed between the first interlayer dielectric layer 208 and one end of the second channel layer 292, the drive transistor Dx that includes the drive gate DG which is formed on the second channel layer 292 so that a portion of the drive gate DG overlaps the floating diffusion layer 284, and the selection transistor Sx that includes the selection gate SG which is formed on the second channel layer 292 at a position adjacent to the drive gate DG. For example, the floating diffusion layer 284 may serve as the drain of the drive transistor lax and an electrode of a capacitor which functions as the floating diffusion FD.

Furthermore, the unit pixel 110 of the image sensor may further include the second interlayer dielectric layer 210 which is formed on the first interlayer dielectric layer 208 and fifth to eighth vertical elongated contact plugs C5 to C8 which pass through the second interlayer dielectric layer 210. In detail, the fifth contact plug C5 may be coupled to the second channel layer 292 that corresponds to the drain of the drive transistor Dx. The floating diffusion layer 284 may be disposed under the second channel layer 292 in a region that is under the second contact plug C5. Referring to the equivalent circuit, the fifth contact plug C5 may be coupled to the second node N2. Therefore, during the operation, the same level of voltage, for example, the power supply voltage VDD or a higher voltage, may be applied to the fourth contact plug C4 and the fifth contact plug CS. The sixth contact plug C6 may be coupled to the drive gate DG. The seventh contact plug C7 may be coupled to the selection gate SG. The seventh contact plug C7 may be coupled to a row line (not shown). The eighth contact plug C8 may be coupled to the second channel layer 292 that corresponds to the source of the selection transistor Sx. The eighth contact plug C8 may be, coupled to column line (not shown).

The unit pixel 110 of the image sensor may further include a third conductive layer 283 which is formed between the first interlayer dielectric layer 208 and the other end of the second channel layer 292 to serve as the source of the selection transistor Sx. The third conductive layer 283 may be disposed under the eighth contact plug C8.

Hereinafter, the respective components will be described in more detail with reference to the drawings.

The unit pixel 110 of the image sensor in accordance with the embodiment may include the substrate 200 which includes the photoelectric conversion element PD, a vertically extending isolation structure 202 which is formed in the substrate 200 to isolate the photoelectric conversion element PD from an adjacent photoelectric conversion element, the first interlayer dielectric layer 208 and the second interlayer dielectric layer 210 which are formed on the photoelectric conversion element PD.

The substrate 200 may include a semiconductor substrate. The semiconductor substrate may have a single crystal state and include a silicon-containing material. That is, the substrate 200 may include a single-crystal, silicon-containing material. The substrate 200 may include a substrate thinned through a thinning process. For example, the substrate 200 may include a bulk silicon substrate thinned through a thinning process.

The isolation structure 202 may include an Shallow Trench Isolation (STI), a Deep Trench Isolation (DTI) or a potential barrier. The potential barrier may include an impurity region formed by implanting an impurity into the substrate 200. For instance, the potential barrier may include a P-type impurity region formed by implanting a P-type impurity, for example, boron (B), into the substrate 200. The isolation structure 202 may include any one of STI, DTI and potential barriers or a combination of two or mere thereof. For example, the isolation structure 202 that encloses the photoelectric conversion element PD may include a DTI barrier or a combination of DTI and potential barriers.

The photoelectric conversion element PD may include an organic or an inorganic photodiode. For example, the photoelectric conversion element PD may be formed in the substrate 200, and have a structure in which first and second impurity regions 204 and 206 having complementary conductivity types with each other are stacked in the vertical direction. The first impurity region 204 may have a very small thickness compared to that of the second impurity region 206. Each of the first and second impurity regions 204 and 206 may be formed by ion-implanting a predetermined impurity into the substrate 200. In detail, the first impurity region 204 may be set to a P-type impurity region and the second impurity region 206 may be set to an N-type impurity region.

Each of the first interlayer dielectric layer 208 and the second interlayer dielectric layer 210 may include a material selected from the group comprising of oxide, nitride, oxynitride and any combinations thereof. The length of the channel of the transfer transistor Tx may be determined depending on the thickness of the first interlayer dielectric layer 208.

The unit pixel 110 of the image sensor in accordance with the illustrated embodiment may include the opening 212 which passes through the first interlayer dielectric layer 208 and the first conductive layer 281 and exposes the photoelectric conversion element PD, the first channel layer 291 which is formed along the surface of a structure including the opening 212 and the first conductive layer 281, and the transfer transistor Tx that includes the transfer gate TG which is formed on the first channel layer 291 and gapfills at least the opening 212.

The first conductive layer 281 may serve as the drain of the transfer transistor Tx. A parasitic capacitance component that is generated between the first conductive layer 281 and a conductive structure, for example, the transfer gate TG, which overlaps the first conductive layer 281 in the vertical and horizontal directions, may serve as a portion of the floating diffusion. FD. The first conductive layer 281 may include a semiconductor material or metal material. For example, the first conductive layer 281 may include an N-type polysilicon doped with an N-type impurity.

The opening 212 may be formed to provide the transfer transistor Tx having a vertical channel and disposed over a central portion of the photoelectric conversion element PD. The reason for this is to enhance the efficiency of collecting and transmitting a photocharge generated from the photoelectric conversion element PD. The opening 212 may have a pillar shape that may have various plane shapes. For example, the plane shape of the opening 212 may include a polygonal shape including a triangular shape, a circular shape or an elliptical shape. A sidewall of the opening 212 may comprise a vertical sidewall, or an inclined sidewall that is reduced in an inner width as it gets closer to the photoelectric conversion element PD. Although, in the embodiment, there is illustrated the case in which one opening 212 is provided, the number of openings 212 may not be limited to the present embodiment. That is, a plurality of openings 212 may be provided. The more the number of openings 212, the larger the width of the channel of the transfer transistor Tx may be.

The first region 291A of the first channel layer 291 that is formed in the opening 212 may contact the photoelectric conversion element. PD and have a constant thickness along the surface of a structure including the opening 212, that is, along the bottom and side walls of the opening 212. The first channel layer 291 that is formed in the opening 212 and contacts the transfer gate TG may serve as the channel of the transfer transistor T. The first channel layer 291 that contacts the first conductive layer 281 may serve, along with the first conductive layer 281 as the drain of the transfer transistor Tx. The first channel layer 291 including the first region 291A and the second region 291B may be formed to have a constant thickness along its entire extent.

The transfer gate TG may include a first gate dielectric layer 214 which is formed on the first channel layer 291, and a pillar-shaped first gate electrode 216 which is formed on the first gate dielectric layer 214 and gapfills at least the opening 212. The first gate dielectric layer 214 may include a material selected from the group comprising oxide, nitride and oxynitride and any combinations thereof. The first gate electrode 216 may include a semiconductor material or metal material.

The unit pixel 110 may include the first channel layer 291 which is formed on the first interlayer dielectric layer 208, the reset gate RG which is formed on the first channel layer 291, and the reset transistor Rx which includes the first conductive layer 281 formed at the first side of the reset gate RG and the second conductive layer 282 formed at the second side of the reset gate RG. The first conductive layer 281 and the second conductive layer 282 may be interposed between the first interlayer dielectric layer 208 and the first channel layer 291.

The reset gate RG may include a second gate dielectric layer 218 which is formed on the first channel layer 291, and a planar second gate electrode 220 which is formed cm the second gate dielectric layer 218. The second gate dielectric layer 218 and the second gate electrode 220 may be respectively formed along with the first gate dielectric layer 214 and the first gate electrode 216 and be made of the same materials as them. The second gate dielectric layer 218 may include a material selected from the group comprising oxide, nitride and oxynitride and any combinations thereof. The second gate electrode 220 may include a semiconductor material or metal material.

The first conductive layer 281 formed on the first side of the reset gate RG may serve as the source of the reset transistor Rx. The second conductive layer 282 formed on the second side of the reset gate RG may serve as the drain of the reset transistor Rx. The second conductive layer 282 may be formed along with the first conductive layer 281 and be made of the same material as that of the first conductive layer 281. The second conductive layer 282 may include a semiconductor material or metal material. For example, the second conductive layer 282 may include N-type polysilicon doped with an N-type impurity.

The unit pixel 110 may include the second channel layer 292 which is formed on the first interlayer dielectric layer 208, the floating diffusion layer 284 which is formed between the first interlayer dielectric layer 208 and the second channel layer 292, and the drive transistor lax which includes the drive gate DG that is formed on the second channel layer 292 so that a portion of the drive gate DG overlaps the floating diffusion layer 284. For example, a second side of the drive gate DG, that is, a portion of the second channel layer 292 between the drive gate DG and the selection gate SG, may serve as the source of the drive transistor Dx.

The drive gate DG may serve as an electrode of a capacitor which functions as the floating diffusion FD on an equivalent circuit. The drive gate DG may include a third gate dielectric layer 222 which is formed on the second channel layer 292, and a stepped third gate electrode 224 which is formed on the third gate dielectric layer 222 and a portion of which overlaps the floating diffusion layer 284. The third gate dielectric layer 222 may be formed along with the first gate dielectric layer 214 and the second gate dielectric layer 218 and includes the same material as them. The third gate dielectric layer 222 may include a material selected from the group comprising oxide, nitride and oxynitride and any combinations thereof. The third gate electrode 224 may be formed along with the first gate electrode 216 and the second gate electrode 220 and be made of the same material as them. The third gate electrode 224 may include a semiconductor material or metal material.

The floating diffusion layer 284 may serve as the drain of the drain transistor and an electrode of a capacitor which functions as the floating diffusion FD. The floating diffusion layer 284 may be formed along with the first conductive layer 281 and the second conductive layer 282 and be made of the same material as them. The floating diffusion layer 284 may include a semiconductor material or metal material. For example, the floating diffusion layer 284 may include N-type polysilicon doped with an N-type impurity.

The unit pixel 110 may include the selection transistor Sx. The selection transistor Sx may include the selection gate SG which is formed on the second channel layer 292, and a third conductive layer 283 which is formed adjacent to the selection gate SG between the first interlayer dielectric layer 208 and the second channel layer 292. A portion of the second channel layer 292 between the selection gate SG and the drive gate DG may serve as the drain of the selection transistor Sx.

The selection gate SG may include a fourth gate dielectric layer 226 which is formed on the second channel layer 292, and a fourth gate electrode 228 which is formed on the fourth gate dielectric layer 226. The fourth gate electrode 228 may be planar. The fourth gate dielectric layer 226 may be formed along with the first to third gate dielectric layers 214 to 222 and include the same material as them. The fourth gate dielectric layer 226 may include a material selected from the group comprising oxide, nitride and oxynitride and any combinations thereof. The fourth gate electrode 228 may be formed along with the first to third gate electrodes 216 to 224 and be made of the same material as them. The fourth gate electrode 228 may include a semiconductor material or metal material.

The third conductive layer 283 may serve as the source of the selection transistor Sx. The third conductive layer 283 may be formed along with the floating diffusion layer 284, the first conductive layer 281 and the second conductive layer 282 and be made of the same material as them. The third conductive layer 283 may include a semiconductor material or metal material. For example, the third conductive layer 28 may include N-type polysilicon doped with an N-type impurity.

Furthermore, the unit pixel 110 may include a color separation element 260 which is formed on an incident surface of the photoelectric conversion element PD on which light is incident, and a light focusing element 270 which is formed on the color separation element 260.

The color separation element 228 may include a color filter. The color filter may include a red filter, a green filter, a blue filter, a cyan filter, a yellow filter, a magenta filter, a white filter, a black filter, an IR cutoff filter, and the like. The light focusing element 270 may include a digital lens or hemispherical lens.

The image sensor in accordance with the above-mentioned embodiment has a shape in which the pixel transistors Tx, Rx, Dx and Sx overlap the photoelectric conversion element PD in the vertical direction. Therefore, the embodiment may provide an improved high-integrated image sensor which prevents deterioration in the sensor characteristics, for example sensor sensitivity, resulting from a reduction in the size of the pixel by increasing the sensor fill factor. Each unit pixel of the image sensor includes a vertical channel transfer transistor Tx and thin film transistors forming the reset transistor Rx, drive transistor Dx and selection transistor Sx, hence, the pixel transistors Tx, Rx, Dx and Sx can be effectively disposed and embodied in a limited area.

Hereinafter, a modification of the above-described embodiment will be described with reference to the drawings. For the sake of description, the same reference numerals will be used to indicate the same or like parts. In addition, detailed descriptions of the same or like parts will be omitted, and the following description will be focused on the differences from the above-mentioned embodiment.

Figure 5:
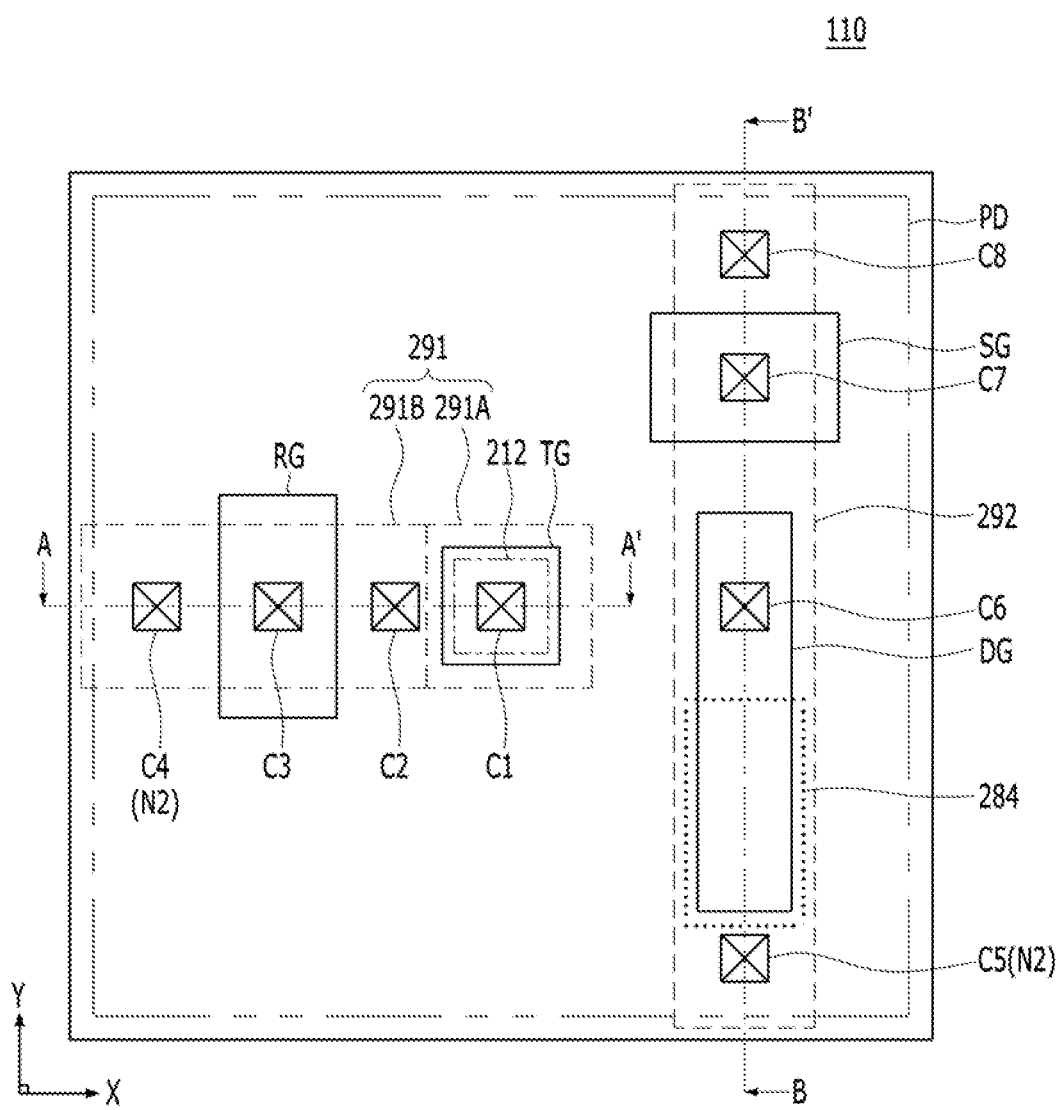
FIG. 5 is a plane view schematically illustrating a unit pixel of an image sensor, in accordance with another embodiment of the present invention.
Figure 6A:
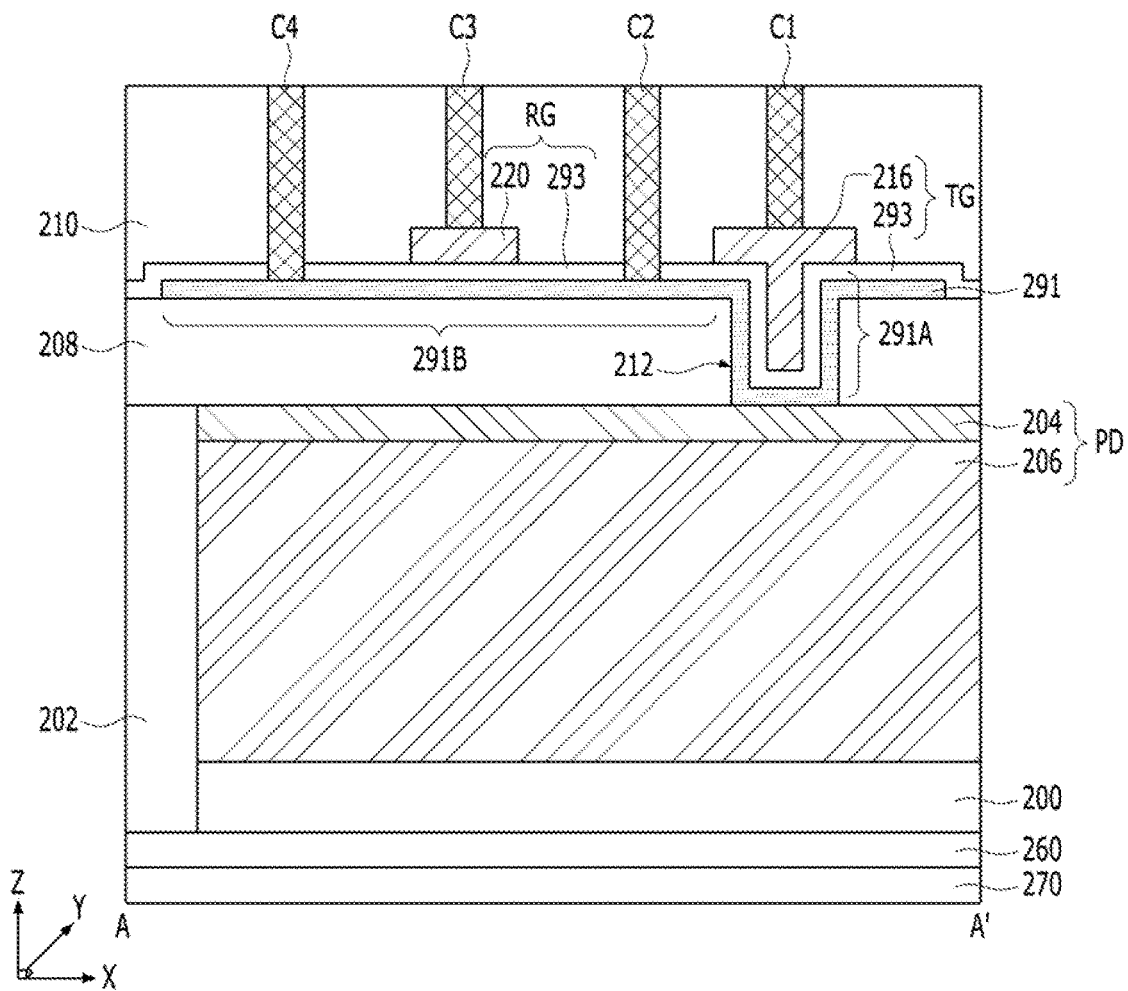
FIGS. 6A and 6B are sectional views respectively taken along line A-A' and line B-B' of FIG. 5.
Figure 6B:
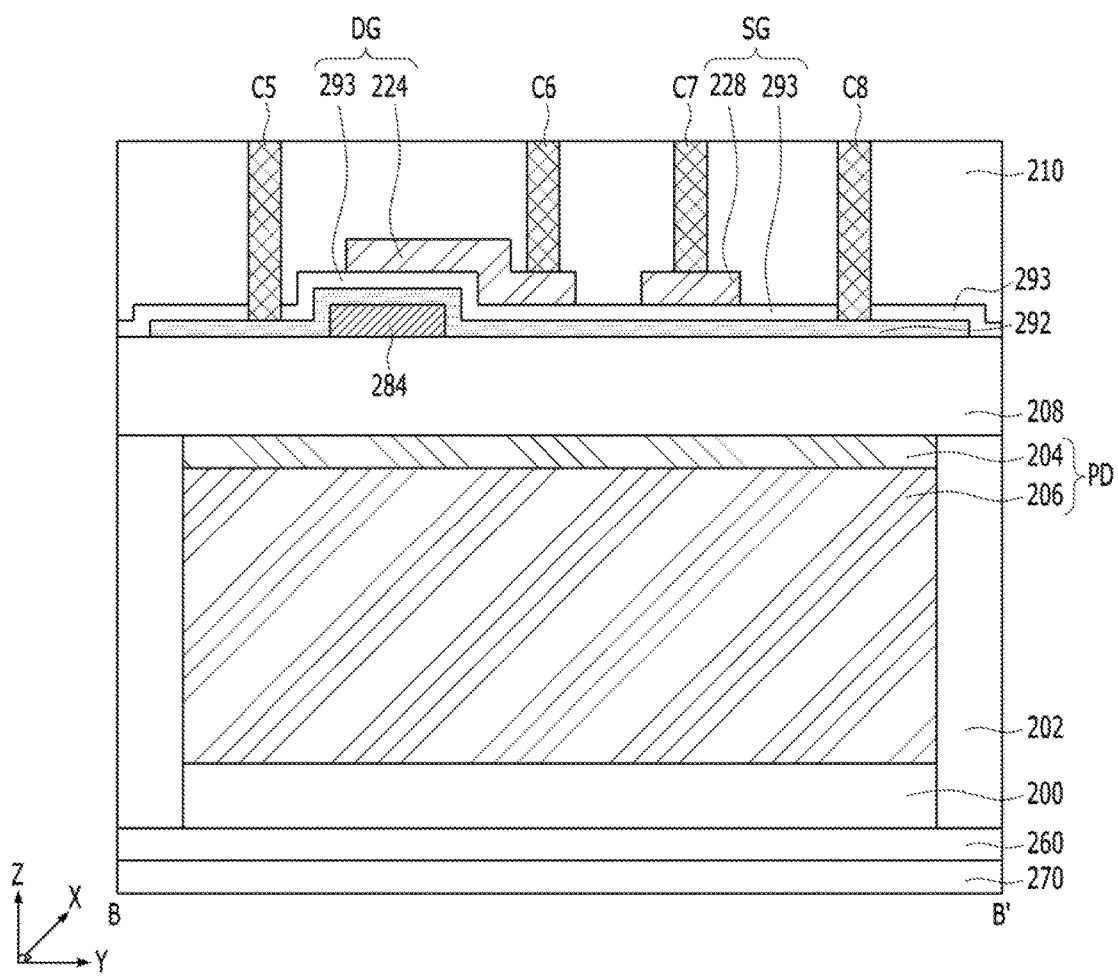

FIG. 5 is a plane view schematically illustrating a unit pixel of an image sensor in accordance with a modification of the embodiment of FIG. 3. FIGS. 6A and 6B are sectional views respectively taken along line A-A' and line B-B' of FIG. 5.

As shown in FIGS. 5, 6A and 6B, the unit pixel 110 may be provided without the first to third conductive layers 281 to 283. The reason for this is to further increase the degree of integration of the unit pixel 110. When the first to third conductive layers 281 to 283 are omitted, the design rule may be secured by margin space that has been provided to secure the distances between the first to third conductive layers 281 to 283 and adjacent structures.

The floating diffusion layer 284 may be configured to be completely overlapped by the drive gate DG for providing the required capacitance of the floating diffusion FD in the unit pixel 110.

The transfer gate TG, the reset gate RG, the drive gate DG and the selection gate SG may include a gate dielectric layer 293 and first to fourth gate electrodes 216, 220, 224, and 228, respectively which are formed on the gate dielectric layer 293. For example, the pixel transistors Tx, Rx, Dx and Sx may share the single gate dielectric layer 293. That is, the gate dielectric layer 293 may cover the entirety of a surface of a structure including the first channel layer 291 and the second channel layer 292. The gate dielectric layer 293 may be formed along the surface of the structure including the first channel layer 291 and the second channel layer 292 and have a constant thickness. Portions of the gate dielectric layer 293 that do not overlap with any one of the first to fourth gate electrodes 216 to 228 may function as a protective layer for the first channel layer 291 and the second channel layer 292, which are formed under the gate dielectric layer 293, thus enhancing the process yield.

FIGS. 7A to 7E and 8A to SE are sectional views taken along line A-A' and line B-B' of FIG. 3 to illustrate a method for fabricating an image sensor in accordance with an embodiment of the present invention.

Figure 7A:
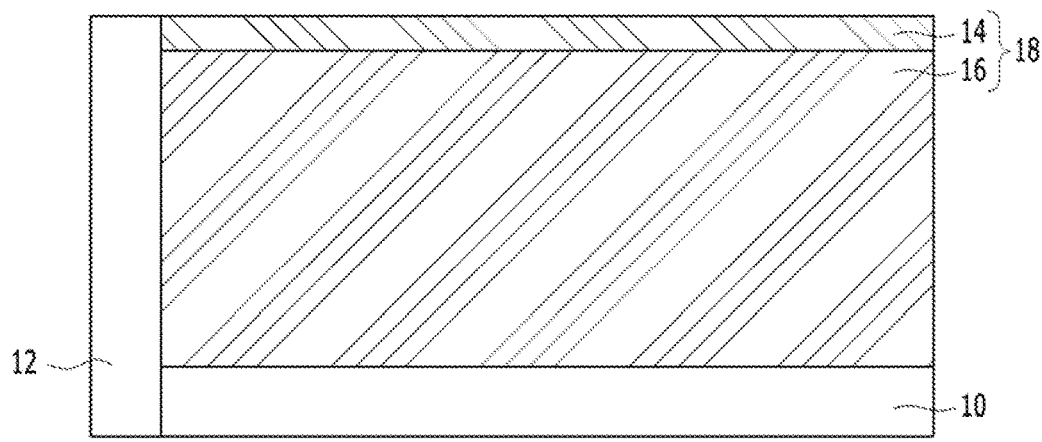
FIGS. 7A to 7E are sectional views taken along line A-A' of FIG. 3 for illustrating a method for fabricating an image sensor, in accordance with an embodiment of the present invention.
Figure 8A:
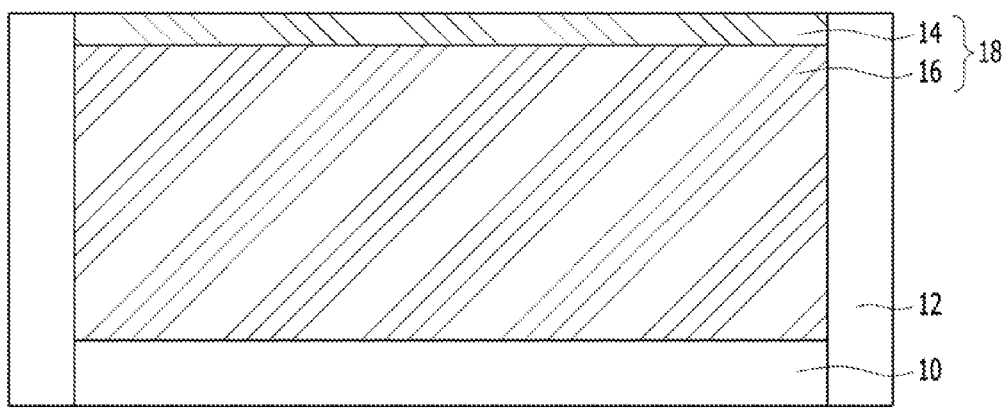
FIGS. 8A to 8E are sectional views taken along line B-B' of FIG. 3 for illustrating a method for fabricating an image sensor, in accordance with an embodiment of the present invention.

As shown in FIGS. 7A and 8A, a photoelectric conversion element 18 and an isolation structure 12 which isolates adjacent photoelectric conversion elements 18 from each other may be formed in a substrate 10.

The substrate 10 may include a single-crystal silicon-containing material. The isolation structure 12 may include an Shallow Trench Isolation (STI), a Deep Trench Isolation (DTI) or a potential barrier. The potential barrier may include an impurity region. The isolation structure 12 may include any one of STI, DTI and potential barriers or a combination of two or more thereof.

The photoelectric conversion element 18 may include a photodiode. For example, the photoelectric conversion element 18 may have a structure in which a first impurity region 14 formed by implanting a P-type impurity into the substrate 10 and a second impurity region 16 formed by implanting an N-type impurity thereinto are vertically stacked. For example, the P-type impurity may include boron (B), and the N-type impurity may include phosphorus (P) or arsenic (As).

Figure 7B:
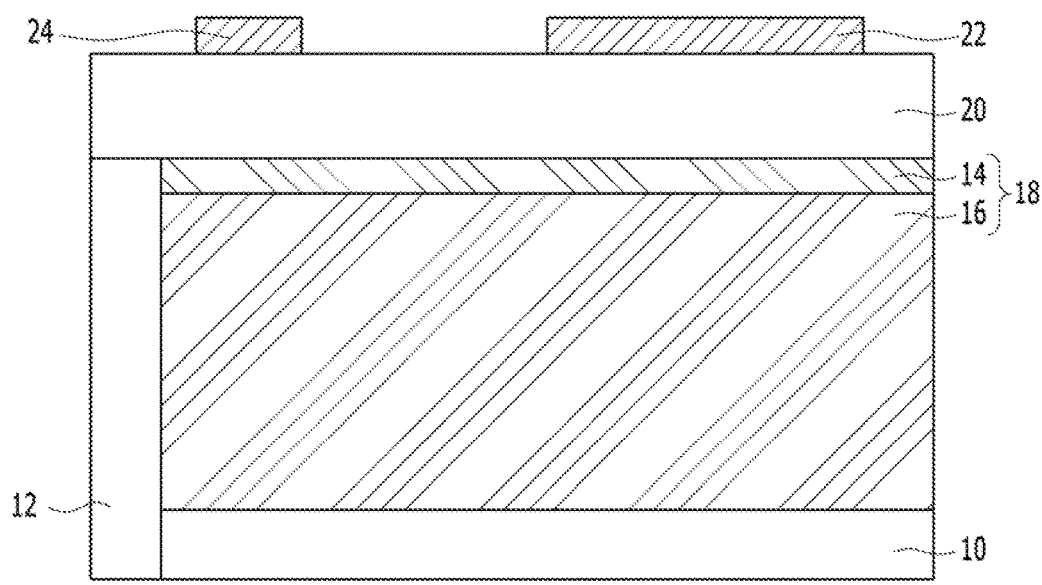
Figure 8B:
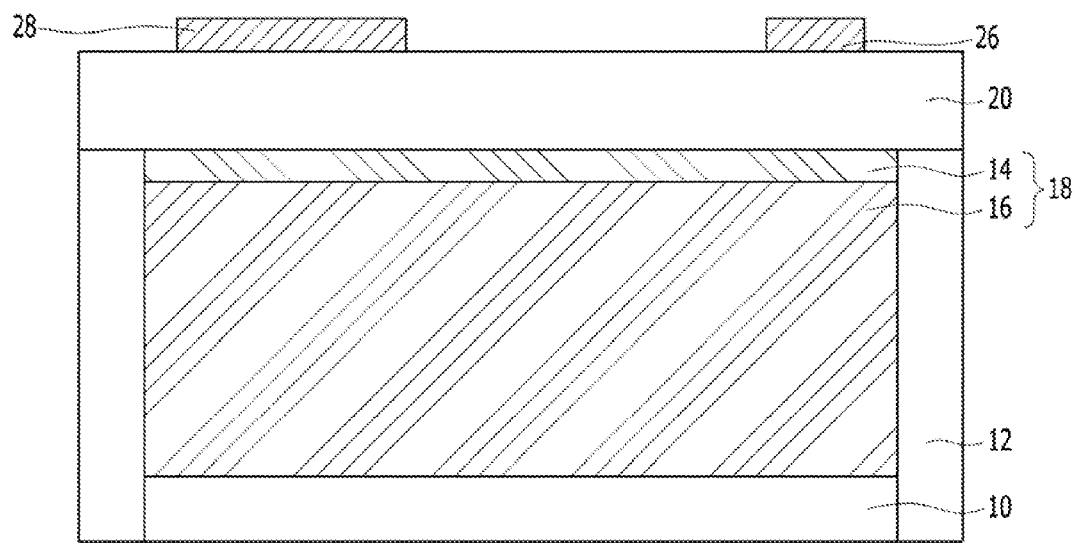

As shown in FIGS. 7B and 8B, a first interlayer dielectric layer 20 may be formed on the substrate 10 on the photoelectric conversion element 18. The first interlayer dielectric layer 20 may include a material selected from the group comprising oxide, nitride and oxynitride and any combinations thereof. For example, the first interlayer dielectric layer 20 may have a structure in which a pad oxide layer, a pad nitride layer and an oxide layer are successively stacked.

Thereafter, a preliminary conductive layer (not shown) and a mask pattern (not shown) are formed on the first interlayer dielectric layer 20, and then a first conductive layer 22, a second conductive layer 24, a third conductive layer 26 and a floating diffusion layer 28 are formed by etching the preliminary conductive layer using the mask pattern as an etching barrier. The preliminary conductive layer may include a semiconductor material or a metal material. For example, the preliminary conductive layer may be formed of N-type polysilicon doped with an N-type impurity.

Figure 7C:
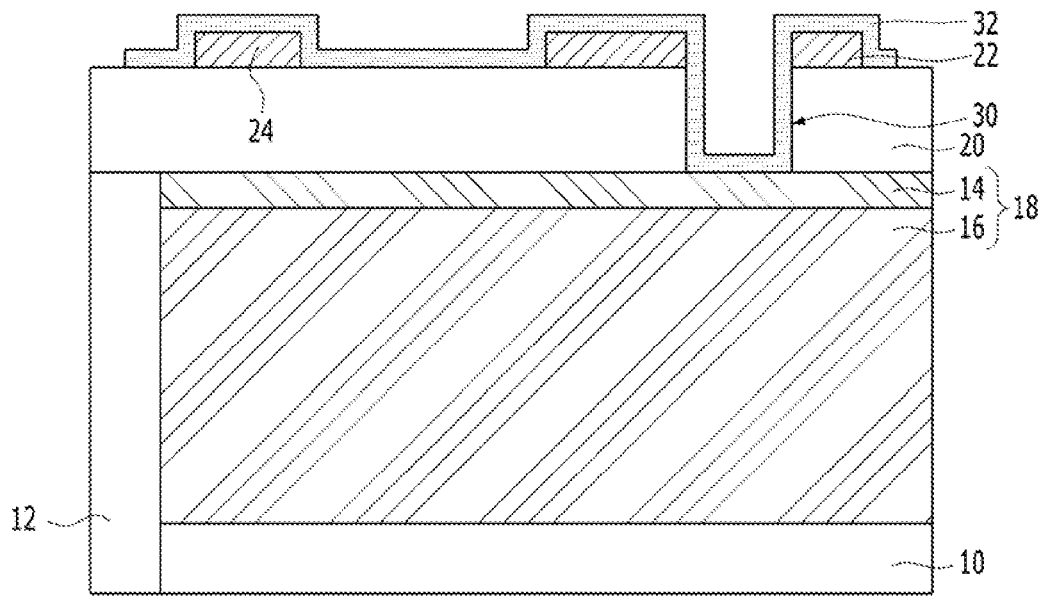
Figure 8C:
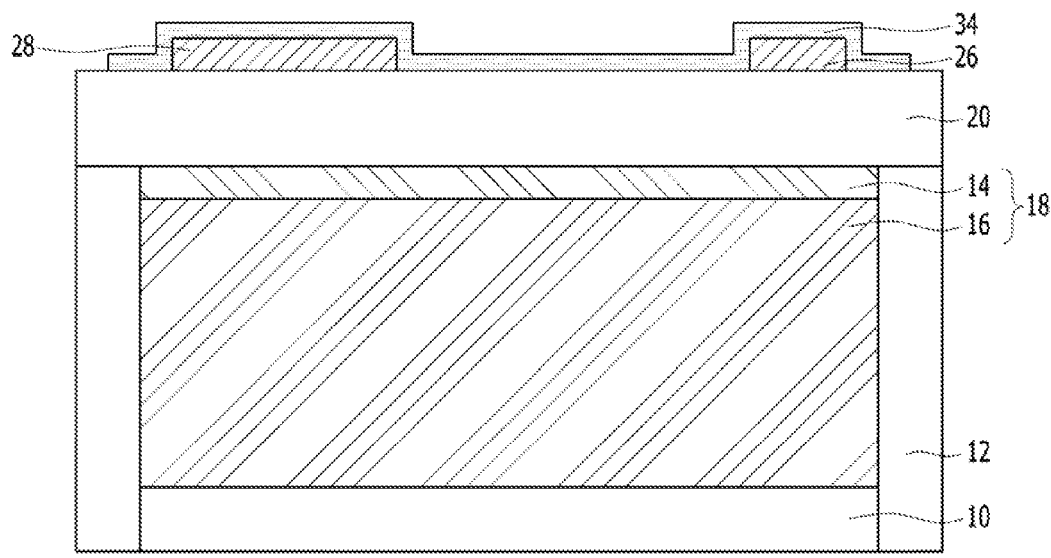

As shown in FIGS. 7C and 8C, an opening 38 which exposes the photoelectric conversion element 18 is formed by selectively etching the first conductive layer 22 and the first interlayer dielectric layer 20. The opening 30 may be formed so that it is disposed in a central portion of the photoelectric conversion element 18. The etching process for forming the opening 30 may include a dry etching process. The opening 30 may have a pillar shape that may have various plane shapes. For example, the plane shape of the opening 30 may be a circular shape, an elliptical shape, or a polygonal shape including a triangular shape. A sidewall of the opening 30 may be vertical or substantially vertical. In another embodiment (not shown), a sidewall of the opening 30 may include an inclined sidewall that is reduced in an inner width as it gets closer to the photoelectric conversion element 18.

Subsequently, a preliminary channel layer (not shown) is formed with a constant thickness along the entirety of the surface of a structure including the opening 30. The preliminary channel layer may include a silicon-containing material. For example, the preliminary channel layer may include polysilicon. In an embodiment, the preliminary channel layer may be formed of any one of undoped polysilicon in which no impurity has been doped, P-type polysilicon doped with a P-type impurity, and N-type polysilicon doped with an N-type impurity.

Thereafter, a mask pattern (not shown) is formed on the preliminary channel layer, and then a first channel layer 32 and a second channel layer 34 are formed by etching the preliminary channel layer using the mask pattern as an etching barrier. A portion of the first channel layer 32 may be formed in the opening 30.

In the described embodiment, there is illustrated the case in which the first channel layer 32 and the second channel layer 34 have the same conductivity type. However, in a variation of this embodiment the first channel layer 32 and the second channel layer 34 may have different conductivity types, in which case, a series of processes including forming a sacrificial layer covering the preformed channel layer, repeatedly performing the above-mentioned process, and then removing the sacrificial layer may be employed.

Figure 7D:
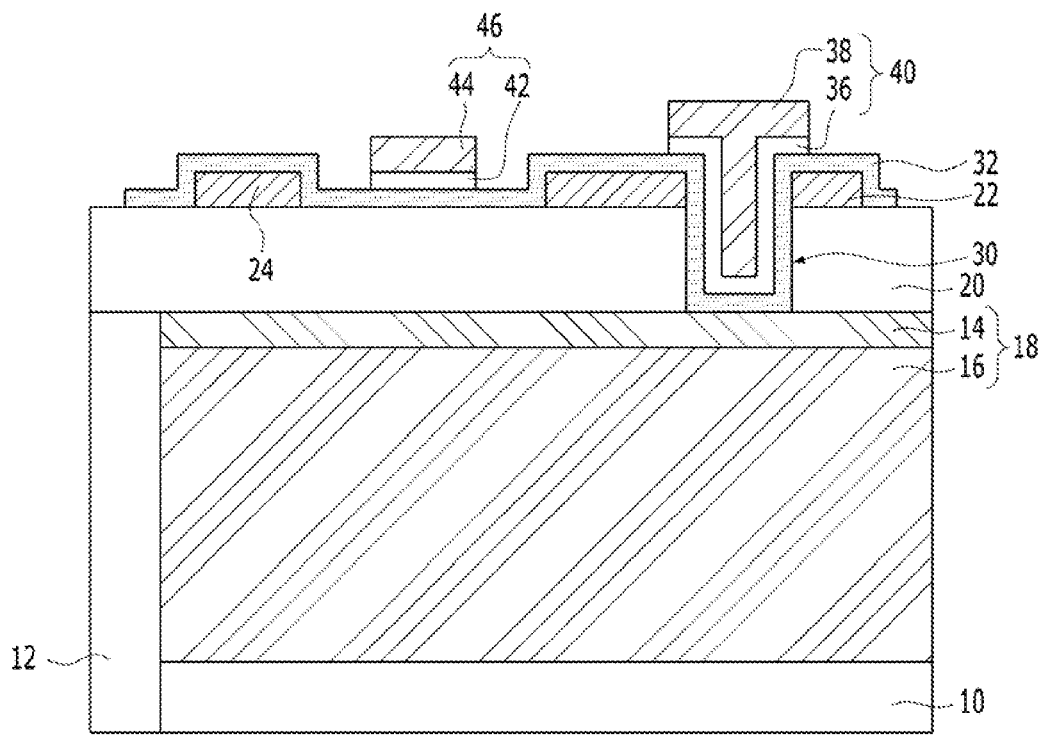
Figure 8D:
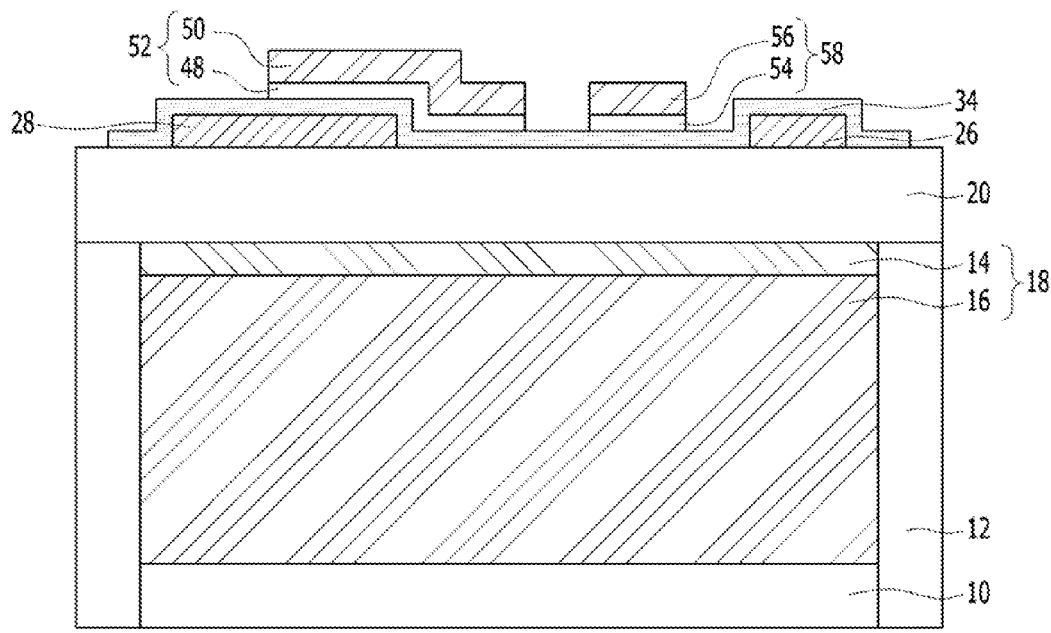

As shown in FIGS. 7D and 8D, a preliminary gate dielectric layer (not shown) is formed on the entirety of a surface of a structure including the first channel layer 32 and the second channel layer 34. The preliminary gate dielectric layer may be formed with a constant thickness along the surface of the structure. The preliminary gate dielectric layer may include a material selected from the group comprising oxide, nitride oxynitride and any combinations thereof.

Subsequently, a gate conductive layer (not shown) is formed on the preliminary gate dielectric layer. The gate conductive layer may gapfill the opening 30 and cover the entirety of the surface of the structure. The gate conductive layer may be made of a semiconductor material or a metal material.

Subsequently, a mask pattern (not shown) is formed on the gate conductive layer, and then a transfer gate 40, a reset gate 46, a drive gate 52 and a selection gate 58 are formed by etching the gate conductive layer and the preliminary gate dielectric layer using the mask pattern as an etching barrier. Each of the transfer gate 40, the reset gate 46, the drive gate 52 and the selection gate 58 may have a structure in which a gate dielectric layer 36, 42, 48, 54 and a gate electrode 38, 44, 50, 56 are stacked.

Figure 7E:
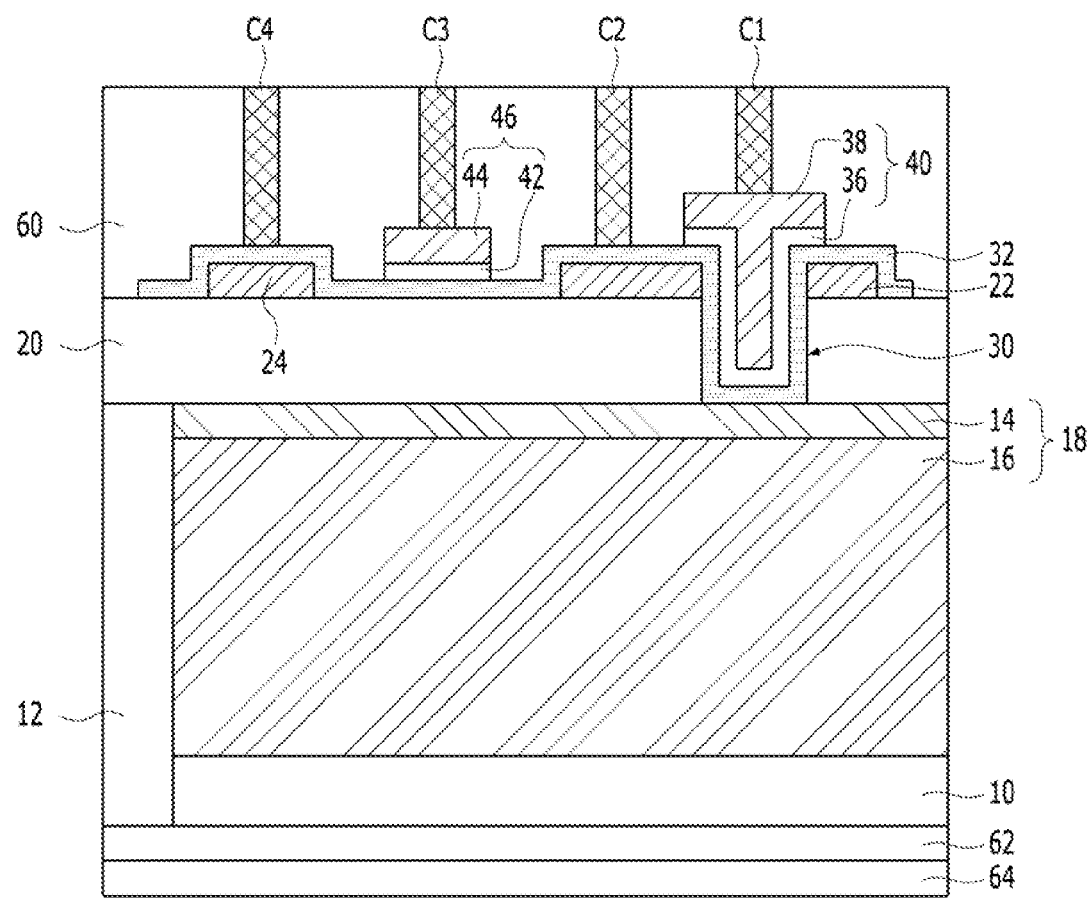
Figure 8E:
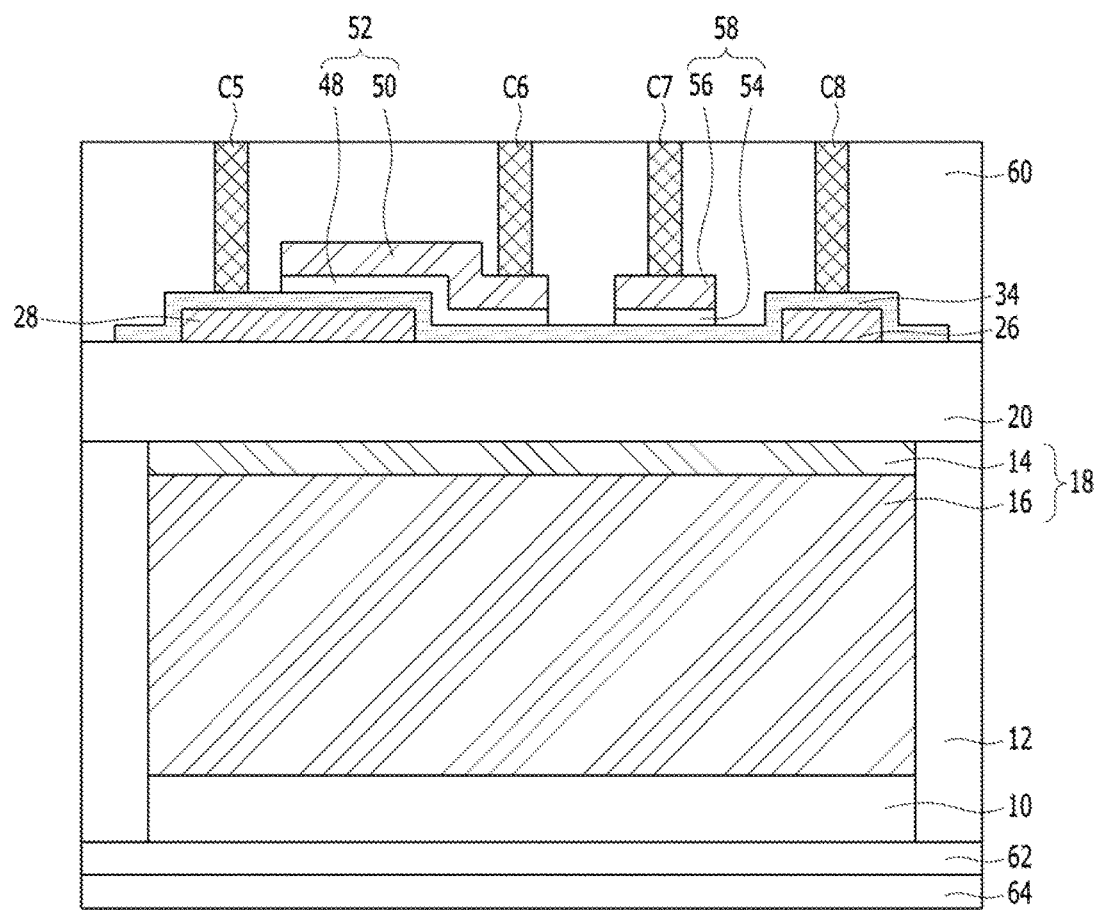

In this way, a pillar-shaped transfer gate 40 that gapfills the opening 30, a planar reset gate 46 is formed on the first channel layer 32 between the first conductive layer 22 and the second conductive layer 24, a stepped drive gate 52 is formed on the second channel layer 34 with a portion thereof overlapping the floating diffusion layer 28, and a planar selection gate 58 is formed on the second channel layer 34 between the drive gate 52 and the third conductive layer 26. As shown in FIGS. 7E and 8E, a second interlayer dielectric layer 60 is formed on the first interlayer dielectric layer 20. The second interlayer dielectric layer 60 may include a material selected from the group comprising oxide, nitride, oxynitride and any combinations thereof.

Thereafter, first to eighth contact plugs C1 to C8 are formed to pass through the second interlayer dielectric layer 60 and respectively contact the transfer gate 40, the first channel layer 32 on the first conductive layer 22, the reset gate 46, the first channel layer 32 on the second conductive layer 24, the second channel layer 34 on the floating diffusion layer 28, the drive gate 52, the selection gate 58, and the second channel layer 34 on the third conductive layer 26.

The first to eighth contact plugs C1 to C8 may be formed through a series of processes including selectively etching the second interlayer dielectric layer 60 and forming contact holes (not shown) through which respective target layers are exposed, depositing a conductive material on the entirety of the surface of the second interlayer dielectric layer 60 so that the gaps of the contact holes are filled with the conductive material, and then performing a planarization process until the second interlayer dielectric layer 60 is exposed so that adjacent contact plugs are separated from each other. The planarization process may be performed, for example, by a chemical-mechanical planarization (CMP) method.

Thereafter a color separation element 62 and a light focusing element 64 are successively formed on an incident surface of the substrate 10 on which light is incident. The color separation element 62 may include a color filter. The light focusing element 64 may include a digital lens or a hemispherical lens.

Then, the image sensor may be completed through a well-known fabrication method.

Figure 9:
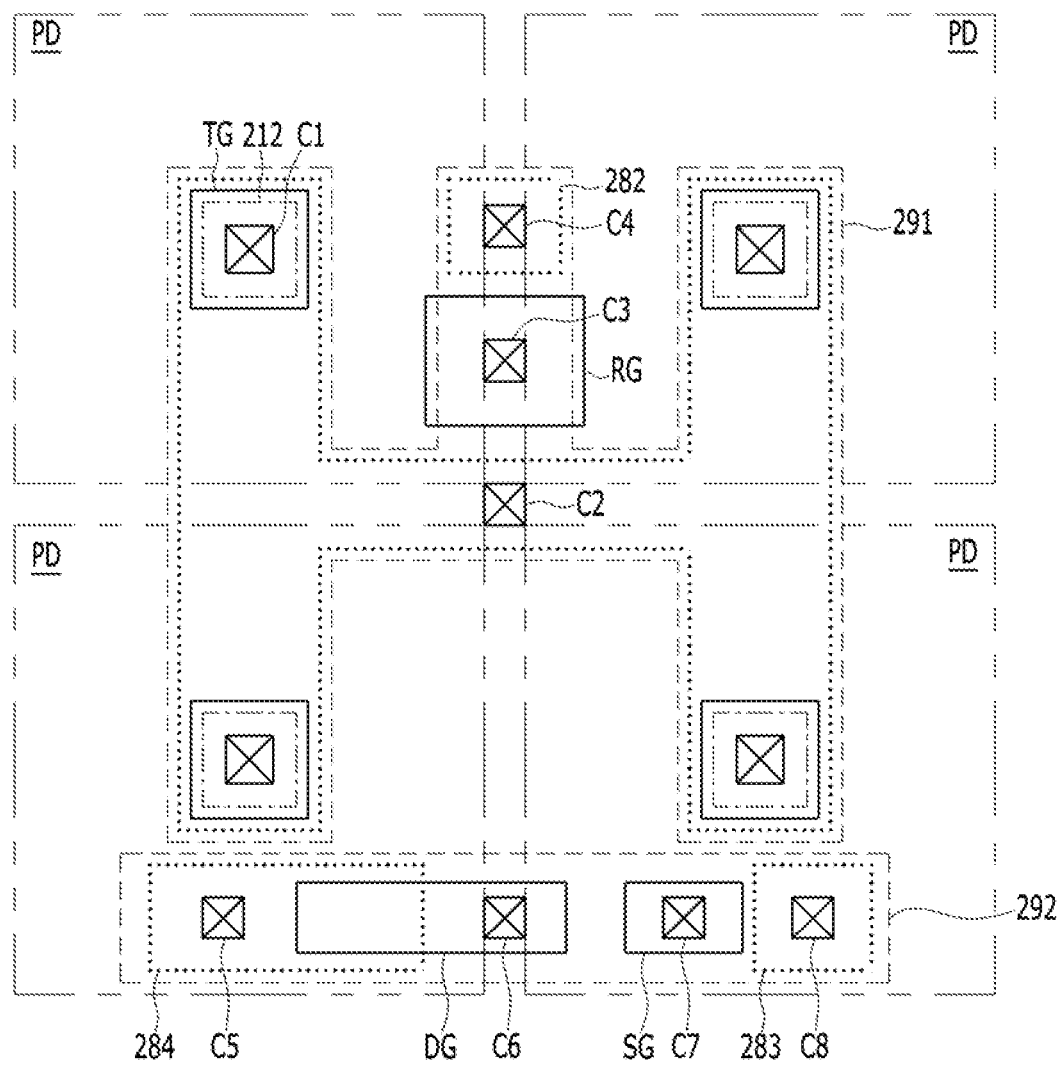
FIG. 9 is a plane view illustrating the unit pixel applied to a shared pixel structure, in accordance with an embodiment of the present invention.

FIG. 9 is a plane view illustrating the case in which a unit pixel is applied to a shared pixel structure, in accordance with an embodiment of the present invention. The same reference numerals as those of FIG. 3 will be used.

As shown in FIG. 9, the unit pixel may be applied to a shared pixel structure. Particularly, in the shared pixel structure, separate space for the pixel transistors Tx, Rx, Dx and Sx is also not required, and they may be formed on a plurality of photoelectric conversion elements PD.

In the same manner as the structure shown in FIG. 3, the shared pixel structure in accordance with the embodiment may have a structure in which the plurality of photoelectric conversion elements PD and the pixel transistors Tx, Rx, Dx and Sx are vertically stacked and overlapped with each other. For example, the transfer transistor Tx may include a vertical channel to transmit a photocharge generated from the photoelectric conversion elements PD, to the floating diffusion FD. Each of the reset transistor Rx, the drive transistor Dx and the selection transistor Sx may be a thin film transistor (TFT). The cross-sectional shapes of the pixel transistors Tx, Rx, Dx and Sx may correspond to those illustrated in FIGS. 4A and 4B or 6A and 6B.

Transfer transistors Tx may be disposed on the respective photoelectric conversion elements PD, and the reset transistor Rx may be disposed between the transfer transistors Tx. The plurality of transfer transistors Tx and the reset transistor Rx may share a first channel layer 291. For this, the first channel layer 291 may have a geometrical shape in which the plurality of transfer transistors Tx and the reset transistor Rx are coupled to each other by the first channel layer 291. Each of the transfer transistors Tx and the reset transistor Rx may have a shape in which they share the first channel layer 291 and are coupled in series to each other.

The drive transistor Dx and the selection transistor Sx may share a second channel layer 292. The second channel layer 292 may overlap a plurality of photoelectric conversion elements RD, and be in the form of a bar, which is disposed on one side of the plurality of transfer transistors Tx and extends in one direction. The drive transistor Dx and the selection transistor Sx may have a shape in which they share the second channel layer 292 and are coupled in series to each other. The layout of a transistor group including the drive transistor Dx and the select transistor Sx may be substantially the same as that illustrated in FIG. 3.

The image sensor in accordance with various embodiments may be used in various electronic devices or systems. Hereinafter, an embodiment in which the image sensor is applied to a camera will be described with reference to FIG. 10.

Figure 10:
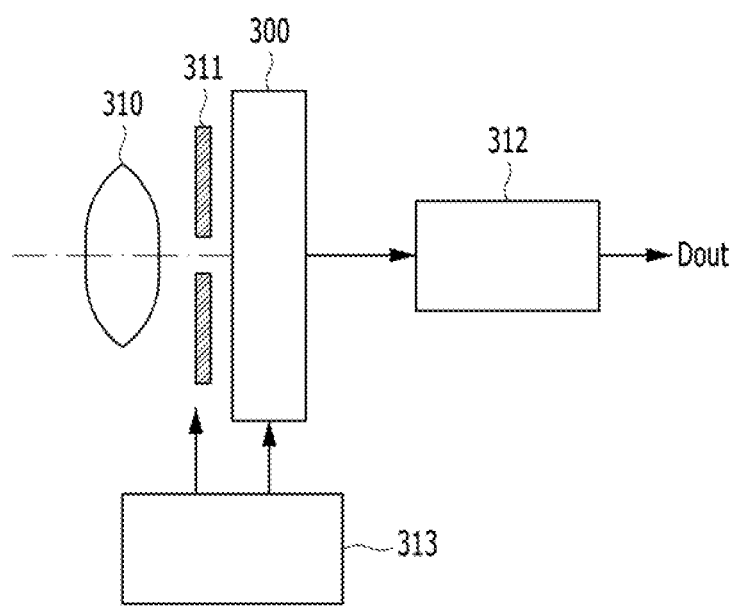
FIG. 10 is a diagram schematically illustrating an electronic device including an image sensor, in accordance with an embodiment of the present invention.

FIG. 10 is a diagram schematically illustrating an electronic device including the image sensor in accordance with an embodiment of the present invention. Referring to FIG. 10, the electronic device may include a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light (incident light) from an object to a pixel array of the image sensor 300. The optical system 310 may include a plurality of optical lenses. Any suitable lenses may be employed including an array of microlenses. The shutter unit 311 may control a light irradiation period and a light interruption period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Gout may be stored in a storage medium such as a memory or outputted to a monitor or the like.

In accordance with various embodiments of the present invention an image sensor is provided which is capable of facilitating high integration and preventing deterioration in sensor characteristics due to an increase in integration density.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a substrate including a photoelectric, conversion element;
   a first interlayer dielectric layer formed over the photoelectric conversion element;
   a channel layer including a first region and a second region, the first region being formed in an opening passing through the first interlayer dielectric layer, with a portion of the first region contacting the photoelectric conversion element, and the second region being formed over the first interlayer dielectric layer;
   a transfer transistor formed over the first region of the channel layer, the transfer transistor including a transfer gate which gapfills the opening; and
   a reset transistor including a reset gate formed over the second region of the channel layer.

2. The image sensor of claim 1, further comprising:
   a second interlayer dielectric layer formed over the first interlayer dielectric layer;
   a first contact plug formed in the second interlayer dielectric layer, the first contact plug being coupled to the transfer gate;
   a second contact plug formed in the second interlayer dielectric layer, the second contact plug being coupled to the channel layer between the reset gate and the transfer gate disposed on one side of the reset gate;
   a third contact plug formed in the second interlayer dielectric layer, the third contact plug being coupled to the reset gate; and
   a fourth contact plug formed in the second interlayer dielectric layer, the fourth contact plug being coupled to the channel layer on the other side of the reset gate.

3. The image sensor of claim 2, further comprising:
   a first conductive layer, which is formed between the first interlayer dielectric layer and the channel layer, and through which the opening passes; and
   a second conductive layer disposed adjacent to the reset gate and formed between the first interlayer dielectric layer and the channel layer.

4. The image sensor of claim 3, wherein the first conductive layer is disposed under the second contact plug, and the second conductive layer is disposed under the fourth contact plug.

5. The image sensor of claim 1, wherein the opening is disposed in a central portion of the photoelectric conversion element.

6. The image sensor of claim 1, wherein the channel layer includes undoped polysilicon, P-type polysilicon or N-type polysilicon.

7. The image sensor of claim 1, wherein the transfer gate comprises:
   a first gate dielectric layer formed over the channel layer; and
   a pillar-shaped first gate electrode formed over the first gate dielectric layer and configured to gapfill at least the opening.

8. The image sensor of claim 1, wherein the reset gate comprises:
   a second gate dielectric layer formed over the channel layer; and
   a planar-shaped second gate electrode formed over the second gate dielectric layer.

9. The image sensor of claim 1,
   wherein the transfer gate and the reset gate include a gate dielectric layer, and
   wherein the gate dielectric layer is formed along a surface of a structure including the first interlayer dielectric layer and the channel layer, has a substantially constant thickness, and covers an entirety of the surface of the structure.

10. An image sensor comprising:
a substrate including a photoelectric conversion element;
a first interlayer dielectric layer formed over the photoelectric conversion element;
an opening formed to pass through the first interlayer dielectric layer to expose the photoelectric conversion element;
a first channel layer including a first region formed in the opening with a portion of the first region contacting the photoelectric conversion element, and a second region formed over a portion of the first interlayer dielectric layer;
a transfer transistor formed over the first region of the first channel layer and including a transfer gate which gapfills the opening;
a reset transistor including a reset gate formed over the second region of the first channel layer;
a second channel layer formed over another portion of the first interlayer dielectric layer;
a floating diffusion layer formed between the first interlayer dielectric layer and a first end of the second channel layer; and
a drive transistor including a drive gate formed over the second channel layer so that a portion of the drive gate overlaps the floating diffusion layer.

11. The image sensor of claim 10, further comprising
a selection transistor including a selection gate disposed adjacent to the drive gate and formed over the second channel layer.

12. The image sensor of claim 11, further comprising:
a second interlayer dielectric layer formed over the first interlayer dielectric layer;
a first contact plug formed in the second interlayer dielectric layer and coupled to the transfer gate;
a second contact plug formed in the second interlayer dielectric layer and coupled to the first channel between the reset gate and the transfer gate disposed on one side of the reset gate;
a third contact plug formed in the second interlayer dielectric layer and coupled to the reset gate;
a fourth contact plug formed in the second interlayer dielectric layer and coupled to the first channel layer on the other side of the reset gate;
a fifth contact plug formed in the second interlayer dielectric layer and coupled to the first end of the second channel layer;
a sixth contact plug formed in the second interlayer dielectric layer and coupled to the drive gate;
a seventh contact plug formed in the second interlayer dielectric layer and coupled to the selection gate; and
an eighth contact plug formed in the second interlayer dielectric layer and coupled to a second end of the second channel layer.

13. The image sensor of claim 12, further comprising:
a first conductive layer formed between the first interlayer dielectric layer and the first channel layer, and through which the opening passes;
a second conductive layer disposed adjacent to the reset gate and formed between the first interlayer dielectric layer and the first channel layer; and
a third conductive layer disposed adjacent to the selection gate and formed between the first interlayer dielectric layer and the second end of the second channel layer.

14. The image sensor of claim 13,
wherein the first conductive layer and the second conductive layer are respectively disposed under the second contact plug and the fourth contact plug, and
wherein the floating diffusion layer and the third conductive layer are respectively disposed under the fifth contact plug and the eight contact plug.

15. The image sensor of claim 10, wherein the opening is disposed in a central portion of the photoelectric conversion element.

16. The image sensor of claim 10, wherein the first channel layer and the second channel have the same conductivity type.

17. The image sensor of claim 16, wherein each of the first channel layer and the second channel layer includes any one of undoped polysilicon, P-type polysilicon or N-type polysilicon.

18. The image sensor of claim 10, wherein the first channel layer and the second channel have different conductivity types.

19. The image sensor of claim 18, wherein the first channel layer includes N-type polysilicon, and the second channel layer includes undoped polysilicon or P-type polysilicon.

20. The image sensor of claim 10, wherein the transfer gate comprises:
a first gate dielectric layer formed over the first channel layer; and
a pillar-shaped first gate electrode formed over the first gate dielectric layer and configured to gapfill at least the opening.

21. The image sensor of claim 10, wherein the reset gate comprises:
a second gate dielectric layer formed over the first channel layer; and
a planar second gate electrode formed over the second gate dielectric layer.

22. The image sensor of claim 10, wherein the drive gate comprises:
a third gate dielectric layer formed over the second channel layer; and
a stepped third gate electrode, which is formed over the third gate dielectric layer, and a portion of which overlaps the floating diffusion layer.

23. The image sensor of claim 10,
wherein the transfer gate, the reset gate and the drive gate include a gate dielectric layer, and
wherein the gate dielectric layer is formed along a surface of a structure including the first interlayer dielectric layer, the floating diffusion layer, the first channel layer and the second channel layer has a substantially constant thickness, and covers an entirety of the surface of the structure.

24. An image sensor comprising:
a photoelectric conversion element;
a transfer transistor and a reset transistor formed over a portion of the photoelectric conversion element and coupled in series to each other while sharing a first channel layer coupled to the photoelectric conversion element; and
a drive transistor and a selection transistor formed over another portion of the photoelectric conversion element and coupled in series to each other while sharing a second channel layer,
wherein the transfer transistor includes a vertical channel, and each of the reset transistor, the drive transistor and the selection transistor comprises a thin film transistor.

25. The image sensor of claim 24, wherein the transfer gate comprises:
   an interlayer dielectric layer formed over the photoelectric conversion element;
   an opening formed to pass through the interlayer dielectric layer and expose the photoelectric conversion element; and
   a transfer gate configured to gapfill the opening,
   wherein the first channel layer is formed along a bottom and a side surface of the opening between the transfer gate and the opening.

26. The image sensor of claim 25, wherein the opening is disposed in a central portion of the photoelectric conversion element.

27. The image sensor of claim 24, wherein the drive transistor comprises:
   an interlayer dielectric layer formed over the photoelectric conversion element;
   the second channel layer formed over the interlayer dielectric layer;
   a floating diffusion layer formed between the second channel layer and the interlayer dielectric layer; and
   a drive gate, which is formed over the second channel layer, a portion of which overlaps the floating diffusion layer.

* * * * *